(12) United States Patent
Park et al.

(10) Patent No.: US 8,847,399 B2
(45) Date of Patent: Sep. 30, 2014

(54) SEMICONDUCTOR DEVICE AND METHOD OF FABRICATING THE SAME

(75) Inventors: Byung-Lyul Park, Seoul (KR); Gil-Heyun Choi, Seoul (KR); Suk-Chul Bang, Yongin-Si (KR); Kwang-Jin Moon, Suwon-Si (KR); Dong-Chan Lim, Suwon-Si (KR); Deok-Young Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 200 days.

(21) Appl. No.: 13/287,317

(22) Filed: Nov. 2, 2011

(65) Prior Publication Data

US 2012/0043666 A1 Feb. 23, 2012

Related U.S. Application Data

(63) Continuation of application No. 12/913,753, filed on Oct. 27, 2010, now Pat. No. 8,076,234.

(30) Foreign Application Priority Data

Jun. 28, 2010 (KR) ........................ 10-2010-0061184

(51) Int. Cl.
*H01L 23/48* (2006.01)
*H01L 23/52* (2006.01)
*H01L 23/40* (2006.01)
*H01L 21/768* (2006.01)
*H01L 25/065* (2006.01)
*H01L 25/18* (2006.01)

(52) U.S. Cl.
CPC . *H01L 21/76898* (2013.01); *H01L 2225/06541* (2013.01); *H01L 2224/16* (2013.01); *H01L 25/18* (2013.01); *H01L 2225/06513* (2013.01); *H01L 25/0657* (2013.01); *H01L 21/76801* (2013.01)
USPC ............................................ 257/774; 257/777

(58) Field of Classification Search
CPC ................... H01L 21/76805; H01L 21/76801; H01L 2225/06541; H01L 2224/16; H01L 2225/06513; H01L 21/76898; H01L 25/0657
USPC .................................................. 257/777, 774
See application file for complete search history.

(56) References Cited

U.S. PATENT DOCUMENTS

| | | | | |
|---|---|---|---|---|
| 7,799,678 B2* | 9/2010 | Kropewnicki et al. | ........ | 438/667 |
| 7,816,945 B2* | 10/2010 | Feng et al. | ........ | 326/38 |
| 7,960,282 B2* | 6/2011 | Yelehanka et al. | ............ | 438/667 |
| 8,043,973 B2* | 10/2011 | Goodlin et al. | ................ | 438/739 |
| 8,487,425 B2* | 7/2013 | Andry et al. | .................... | 257/698 |
| 2009/0289324 A1* | 11/2009 | Goodlin et al. | ................ | 257/506 |
| 2010/0065949 A1* | 3/2010 | Thies et al. | .................... | 257/621 |
| 2010/0078770 A1* | 4/2010 | Purushothaman et al. | ... | 257/621 |
| 2010/0133660 A1* | 6/2010 | Huyghebaert et al. | ........ | 257/621 |
| 2010/0187671 A1* | 7/2010 | Lin et al. | ....................... | 257/686 |

* cited by examiner

*Primary Examiner* — Jarrett Stark
(74) *Attorney, Agent, or Firm* — Monica H. Choi

(57) ABSTRACT

For forming a semiconductor device, a via structure is formed through at least one dielectric layer and at least a portion of a substrate. In addition, a protective buffer layer is formed onto the via structure. Furthermore, a conductive structure for an integrated circuit is formed over the substrate after forming the via structure and the protective buffer layer, with the conductive structure not being formed over the via structure. Thus, deterioration of the conductive and via structures is minimized.

16 Claims, 20 Drawing Sheets

SEMICONDUCTOR DEVICE AND METHOD OF FABRICATING THE SAME

CROSS-REFERENCE TO RELATED APPLICATION(S)

The present application is a continuation of an earlier filed copending patent application with Ser. No. 12/913,753 filed on Oct. 27, 2010, now U.S. Pat. No. 8,076,234 for which priority is claimed. This earlier filed copending patent application with Ser. No. 12/913,753 is in its entirety incorporated herewith by reference.

The present application also claims priority under 35 USC §119 to Korean Patent Application No. 10-2010-0061184, filed on Jun. 28, 2010, in the Korean Intellectual Property Office, the disclosure of which is incorporated herein in its entirety by reference. A certified copy of Korean Patent Application No. 10-2010-0061184 is contained in the parent copending patent application with Ser. No. 12/913,753.

TECHNICAL FIELD

The present invention relates generally to semiconductor devices, and more particularly, to a method of fabricating a conductive structure and a via structure in an integrated circuit with minimized deterioration.

BACKGROUND OF THE INVENTION

Conductive structures and vias are commonly used as interconnect structures to form an integrated circuit of a semiconductor device. Vias are used to connect conductive lines formed on multiple levels of interconnect layers.

In addition, through silicon vias (TSVs) are formed through the silicon substrate for coupling multiple integrated circuit chips to form a stacked semiconductor device. Such a stacked semiconductor device is formed to provide an integrated circuit with high capacity and low area.

Conductive structures such as conductive plugs are formed to provide connection to transistors, diodes, and the like for forming an integrated circuit. The via structures and the conductive structures may be formed through a same inter-metal insulation layer. Such via and conductive structures are desired to be formed with minimized deterioration for high integrity of operation of the integrated circuit.

SUMMARY OF THE INVENTION

Accordingly, a conductive structure is formed after a via structure is formed with a protective layer formed thereon for preserving the integrity of the via structure during formation of the conductive structure.

In a method for forming a semiconductor device according to an aspect of the present invention, a via structure is formed through at least one dielectric layer and at least a portion of a substrate. In addition, a protective buffer layer is formed onto the via structure. Furthermore, a conductive structure for an integrated circuit is formed over the substrate after forming the via structure and the protective buffer layer, with the conductive structure not being formed over the via structure.

In an example embodiment of the present invention, the method also includes the step of heating the via structure to form an initial protrusion portion of the via structure. In that case, the via structure is planarized to remove the initial protrusion portion before forming the protective buffer layer onto the via structure.

In a further example embodiment of the present invention, the protective buffer layer remains on the via structure during the formation of the conductive structure for the integrated circuit.

In another example embodiment of the present invention, the method includes the steps of removing the protective buffer layer from the via structure and forming respective wiring onto each of the via structure and the conductive structure.

In a further example embodiment of the present invention, the method includes the step of forming a first insulation layer onto at least one wall of an opening having the via structure formed therein. In addition, a second insulation layer is formed over the substrate with the via structure being planar with the second insulation layer, before the step of forming the protective buffer layer.

In another example embodiment of the present invention, a ratio of a first thickness of the first insulation layer to a second thickness of the second insulation layer is in a range of from about 0.3:1 to about 0.9:1.

In a further example embodiment of the present invention, a thickness of the first insulation layer is less than ¼ of a diameter of the opening having the via structure formed therein.

In another example embodiment of the present invention, the method includes the steps of forming a barrier layer on the first insulation layer within the opening and forming a conductive fill within the opening after forming the barrier layer.

In a further example embodiment of the present invention, the conductive fill is comprised of copper.

In another example embodiment of the present invention, the method includes the step of forming a center fill within the opening such that the conductive fill surrounds at least a portion of the center fill. In that case, the center fill has a thermal expansion coefficient that is lower than that of the conductive fill.

In a further example embodiment of the present invention, the via structure is a TSV (through silicon via) formed within the opening through the at least one dielectric layer and the substrate. The TSV is coupled to a contact structure of another semiconductor device for forming a stacked semiconductor device that may be a memory device in an example embodiment of the present invention.

In this manner, the conductive structure is formed after the protective buffer layer is formed to cover the via structure to prevent deterioration of the via structure during formation of the conductive structure. Thus, the integrity of operation of the integrated circuit having such conductive and via structures is preserved.

These and other features and advantages of the present invention will be better understood by considering the following detailed description of the invention which is presented with the attached drawings.

Figure 1:
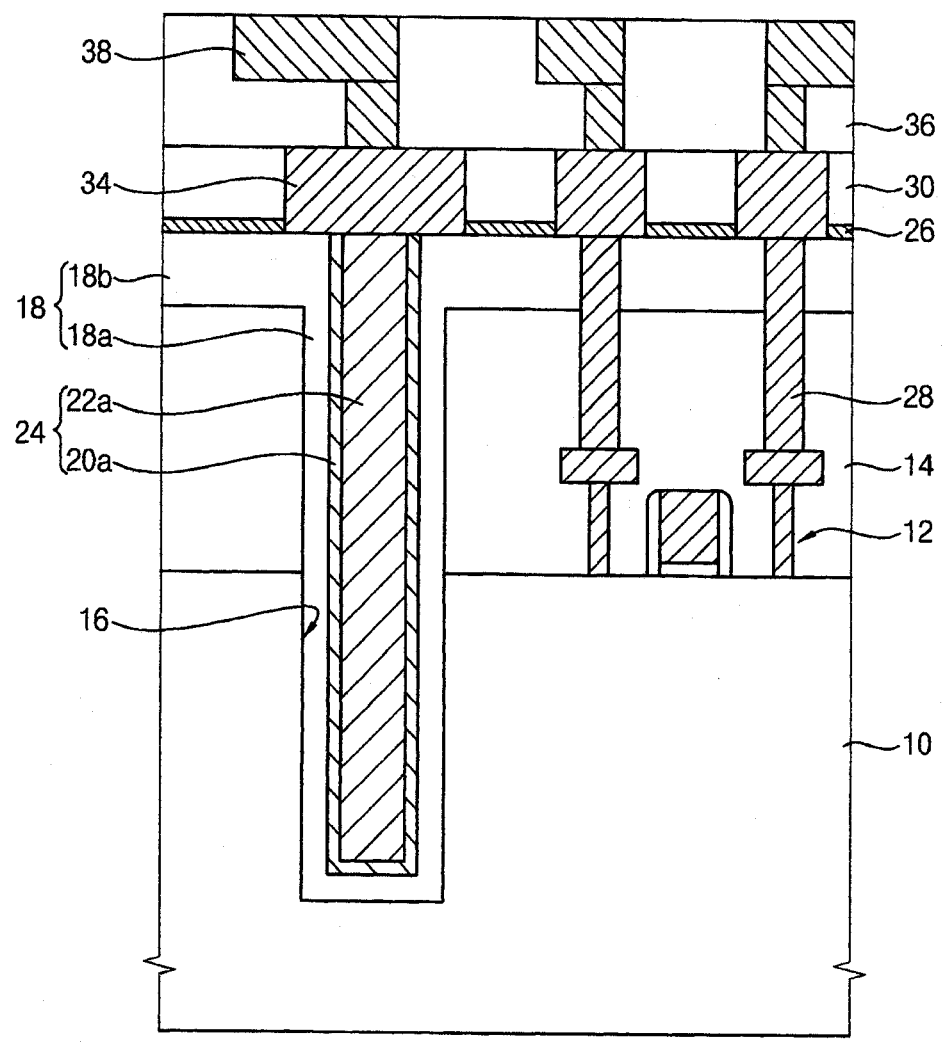
FIG. 1 is a cross-sectional view of a semiconductor device having a conductive structure and a via structure formed with method steps according to example embodiments of the present invention.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, 24, 25, and 26 refer to elements having similar structure and/or function, unless stated other-wise.

DETAILED DESCRIPTION

Various example embodiments are described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of fabrication techniques and/or tolerances, are to be expected. Thus, example embodiments should not be construed as limited to the particular shapes of regions illustrated herein but are to include deviations in shapes that result, for example, from fabrication.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Referring to FIG. 1, a first circuit pattern 12 is formed on a first substrate 10 that is comprised of a semiconductor material such as single crystalline silicon for example. The first circuit pattern 12 includes transistors, diodes, and the like for forming an integrated circuit. A first insulating interlayer 14 is formed on the first substrate 10 to surround the first circuit pattern 12. Conductive structures such as conductive plugs 28 comprised of a conductive material such as polysilicon for example are formed for electrically connecting to the first circuit pattern 12.

A via hole 16 is formed as an opening through the first insulating interlayer 14 and through at least a portion of the first substrate 10. The via hole 16 has a depth of from about 10 μm to about 100 μm and preferably from about 30 μm to about 60 μm, in an example embodiment of the present invention. The via hole 16 has a diameter of from about 1 μm to about 30 μm and preferably from about 1 μm to about 10 μm, in an example embodiment of the present invention. A plurality of via holes 16 may be formed in an example embodiment of the present invention.

An insulation layer structure 18 is formed on an inner wall of the via hole 16 and on the first insulating interlayer 14. The insulation layer structure 18 includes a first insulation layer 18a and a second insulation layer 18b. The first insulation layer 18a is formed on the inner wall of the via hole 16 for electrically insulating the first substrate 10 from a through silicon via (TSV) structure 24 formed within the via hole 16.

The second insulation layer 18b is formed on the first insulating interlayer 14 and on the top surface of the first insulation layer 18a. The first insulating interlayer 14 together with the second insulation layer 18b function as an insulating interlayer structure having a total thickness that is the sum of the thicknesses of the first and second insulating interlayers 14 and 18b.

The insulation layer structure 18 is comprised of a material having a low dielectric constant such that the parasitic capacitance between the first substrate 10 and the conductive material of the TSV structure 24 is minimized. For example, the insulation layer structure 18 is comprised of silicon oxide or carbon-doped silicon oxide that may be porous, in an example embodiment of the present invention.

The insulation layer structure 18 has a relatively large thickness such that the parasitic capacitance between the first substrate 10 and the TSV structure 24 is minimized. If the first insulation layer 18a has a thickness that is less than about 1000 Å, the first insulation layer 18a may not provide sufficient insulation.

If the first insulation layer 18a has a thickness that is larger than about ¼ of the diameter of the via hole 16, the TSV structure 24 may have an insufficient volume, thereby resulting in increased resistance of the TSV structure 24. Thus, the first insulation layer 18a is formed with a thickness that is higher than about 1000 Å and that is less than about ¼ of the diameter of the via hole 16. The first and second insulation layers 18a and 18b may be formed to have different thicknesses.

A barrier layer pattern 20a is formed on the first insulation layer 18a and is exposed in the via hole 16 at a top surface that is coplanar with that of the second insulation layer 18b. The barrier layer pattern 20a has a cup shape to surround a conductive fill 22a. The barrier layer pattern 20a is comprised of a metal or a metal nitride such as tantalum, tantalum nitride, titanium, titanium nitride, ruthenium, cobalt, nickel, nickel boride, tungsten nitride, and the like, alone or in a combination thereof, in an example embodiment of the present invention.

A conductive fill 22a fills an inner space formed by the barrier layer pattern 20a within the via hole 16. The conductive fill 22a is comprised of a metal having a low resistance such as copper or tungsten for example. In an example embodiment of the present invention, the conductive fill 22a is comprised of copper. The conductive fill 22a and the barrier layer pattern 20a form the TSV structure 24. The TSV structure 24 has a top surface of portions of the conductive fill 22a and the barrier layer pattern that are coplanar with a top surface of the second insulation layer 18b.

Further referring to FIG. 1, a protective buffer layer 26 is formed on the TSV structure 24 and the second insulation layer 18b (see FIG. 7) for preventing the conductive material of the TSV structure 24 from diffusing into other elements. The buffer layer 26 is comprised of silicon nitride, silicon carbonitride (SiCN), silicon carbo-oxynitride (SiCON), and the like, alone or in a combination thereof, according to an example embodiment of the present invention. The buffer layer 26 has a thickness of from about 300 Å to about 1000 Å, according to an example embodiment of the present invention.

A contact plug 28 that is an example conductive structure is formed through the second insulation layer 18b and in the first insulating interlayer 14 for electrically connecting to the first circuit pattern 12. The contact plug 28 has a top surface coplanar with that of the TSV structure 24. The contact plug 28 is comprised of a metal such as tungsten or copper for example. The contact plug 28 may be formed with a barrier layer (not shown) and such a metal.

A first inter-metal dielectric layer 30 is formed on the buffer layer 26. The first inter-metal dielectric layer 30 is comprised of a material having a low dielectric constant such as silicon oxide, carbon-doped silicon oxide, and the like, for example.

A plurality of first wirings 34 are formed through the first inter-metal dielectric layer 30 and the buffer layer 26. Some of the first wirings 34 contact the top surface of the TSV structure 24, and others of the first wirings 34 contact the top surface of the contact plug 28. The first wirings 34 may be formed with a barrier layer (not shown) and a metal such as copper or tungsten for example. In an example embodiment of the present invention, the first wirings 34 are comprised of copper.

A second inter-metal dielectric layer 36 is formed on the first inter-metal dielectric layer 30 and the first wirings 34. A plurality of second wirings 38 are formed through the second inter-metal dielectric layer 36 for being electrically connected to the first wirings 34. A third inter-metal dielectric layer (not shown) and/or third wirings (not shown) may be further formed.

The semiconductor device of FIG. 1 has good insulation characteristics and a low parasitic capacitance between the first substrate 10 and the TSV structure 24. Additionally, the TSV structure 24 has a low resistance and good signal transfer characteristics.

FIGS. 2, 3, 4, 5, 6, 7, 8, 9, and 10 are cross-sectional views illustrating method steps during fabrication of the semiconductor device of FIG. 1, according to an example embodiment of the present invention.

Figure 2:
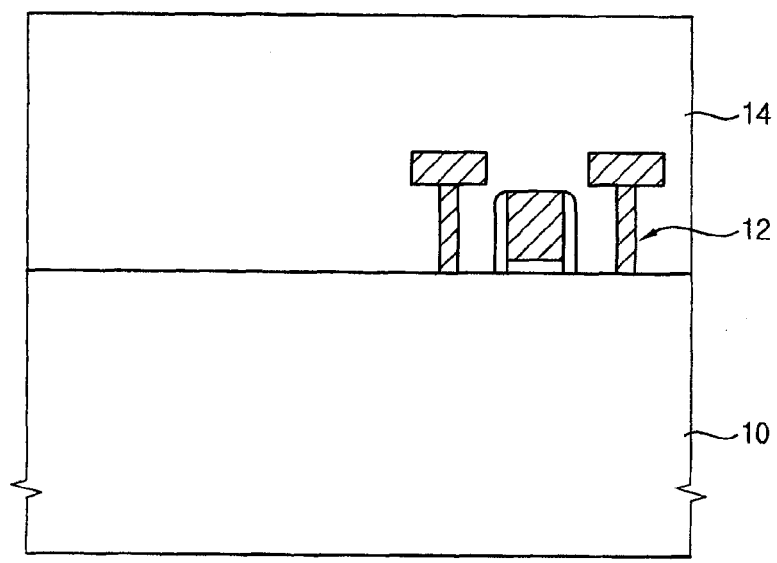
FIGS. 2, 3, 4, 5, 6, 7, 8, 9, and 10 are cross-sectional views illustrating method steps during fabrication of the semiconductor device of FIG. 1, according to example embodiments of the present invention.

Referring to FIG. 2, the first circuit pattern 12 is formed on the first substrate 10 and includes transistors, diodes, and the like for forming an integrated circuit. The first insulating interlayer 14 is formed on the first substrate 10 to surround the first circuit pattern 12. During subsequent fabrication, the second insulation layer 18b also serving as an insulating interlayer is further formed (see FIG. 4). Thus, the first insulating interlayer 14 may be formed to have a relatively small thickness.

Figure 3:
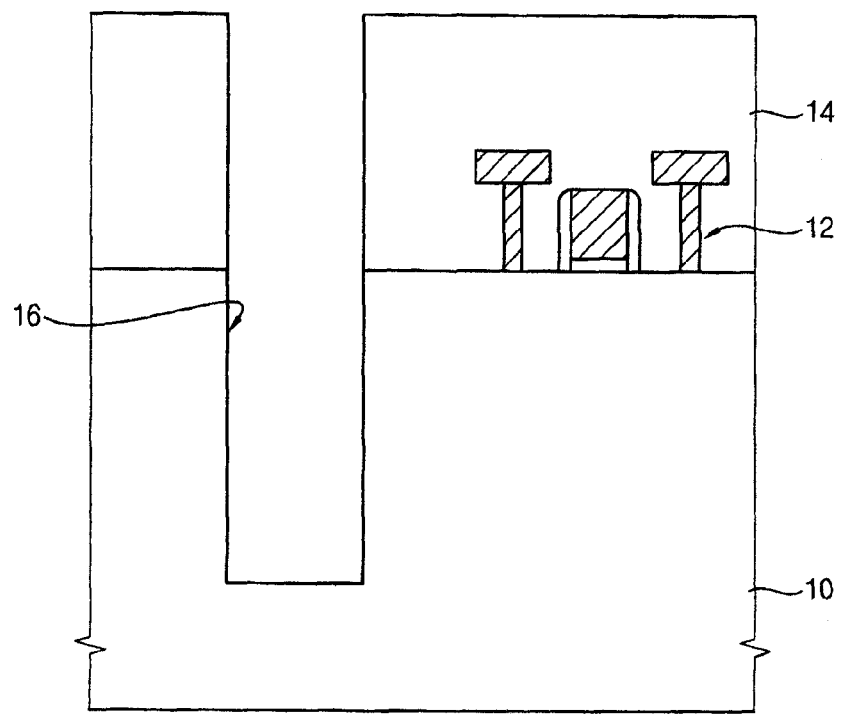

Referring to FIG. 3, a photo-resist pattern (not shown) having a thickness of from about 2 μm to about 5 μm is formed on the first insulating interlayer 14. The first insulating interlayer 14 and a portion the first substrate 10 are etched using the photo-resist pattern as an etching mask to form the via hole 16 through the first insulating interlayer 14 and in the first substrate 10.

If the via hole 16 is formed to have a depth less than about 10 μm, the TSV structure 24 formed in the via hole 16 may have insufficient volume. If the via hole 16 is formed to have a depth more than about 100 μm, filling the via hole 16 with a conductive material may be difficult. Thus, the via hole 16 is formed to have a depth of from about 10 μm to about 100 μm and preferably from about 30 μm to about 60 μm, in an example embodiment of the present invention.

If the via hole 16 has a diameter less than about 1 μm, filling the via hole 16 with a conductive material may be difficult. If the via hole 16 has a diameter more than about 30 μm, the semiconductor device may not be formed with high integration density. Thus, the via hole 16 is formed to have a diameter of from about 1 μm to about 30 μm, in an example embodiment of the present invention. The present invention may be practiced with formation of a plurality of via holes 16. The photo-resist pattern is removed after patterning of the via holes 16.

Figure 4:
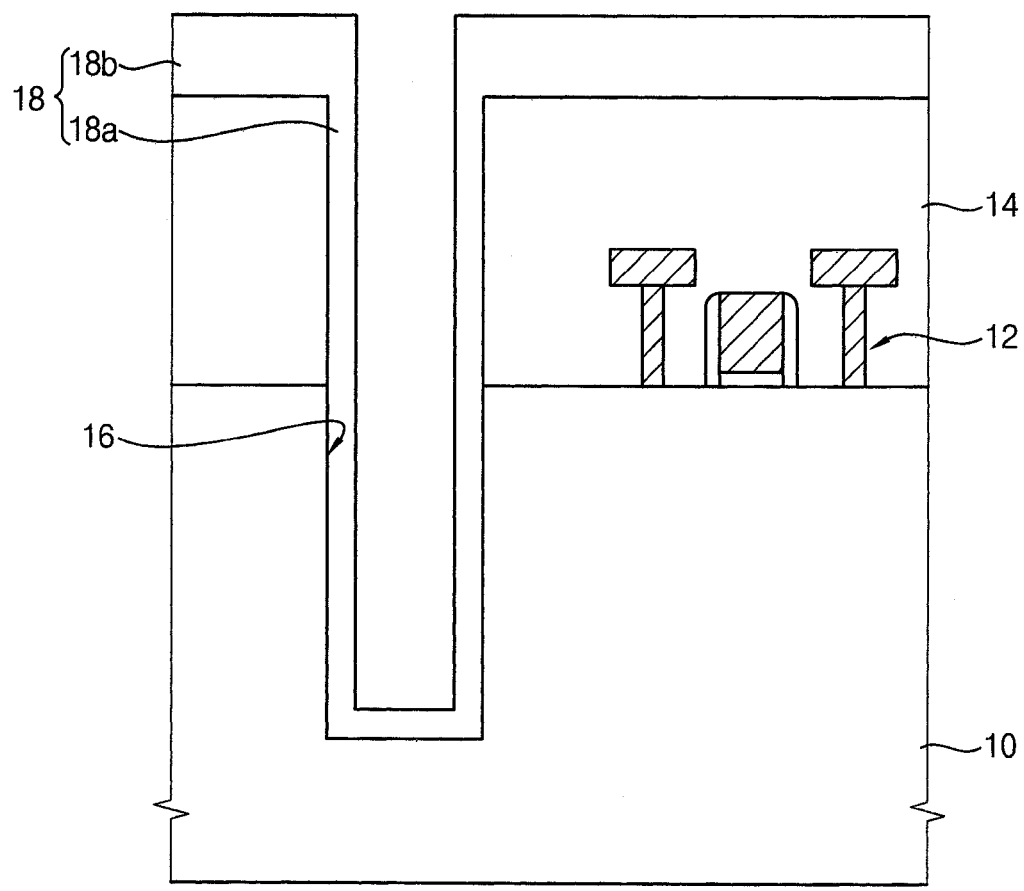

Referring to FIG. 4, the insulation layer structure 18 is formed on the inner wall of the via hole 16 and on the first insulating interlayer 14. The first insulation layer 18a is formed to electrically insulate the first substrate 10 from the conductive material of the TSV structure 24. The second insulation layer 18b serves as an insulating interlayer.

The insulation layer structure 18 is comprised of a material having a low dielectric constant such as silicon oxide or carbon-doped silicon oxide, in an example embodiment of the present invention. For example, the insulation layer structure 18 may be formed using tetraethyl orthosilicate (TEOS) or ozone TEOS having good step coverage characteristics. The insulation layer structure 18 may be formed by a plasma oxidation process or a chemical vapor deposition (CVD) process.

The first insulation layer 18a is formed to have a thickness that is more than about 1000 Å and smaller than about ¼ of the diameter of the via hole 16. The second insulation layer 18b is formed with a higher thickness than the first insulation layer 18a. In an example embodiment of the present invention, the first and second insulation layers 18a and 18b are formed to have a thickness ratio of from about 0.3:1 to about 0.9:1. When the second insulation layer 18b is formed to have a relatively large thickness, the first insulating interlayer 14 may be formed to have a relatively small thickness in FIG. 2.

Figure 5:
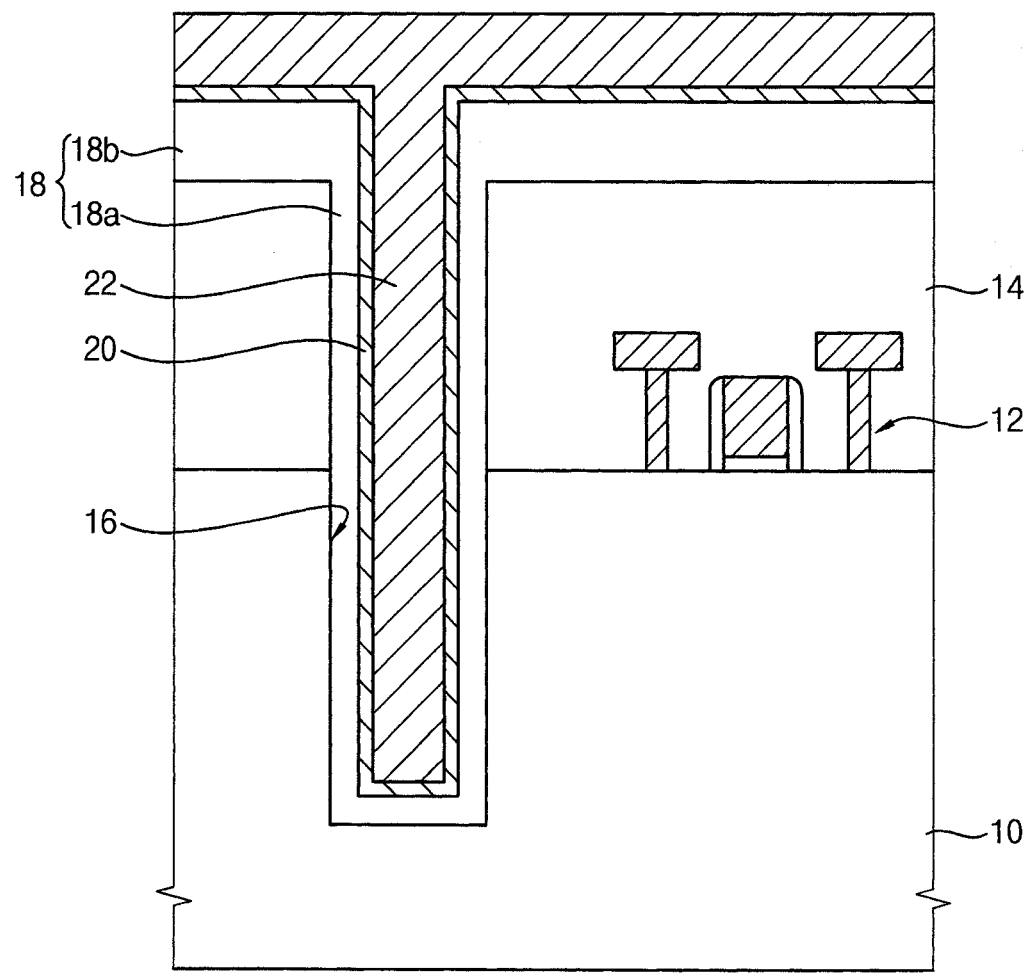

Referring to FIG. 5, a barrier layer 20 is formed on the insulation layer structure 18 and is comprised of a metal or a metal nitride such as tantalum, tantalum nitride, titanium, titanium nitride, ruthenium, cobalt, nickel, nickel boride, tungsten nitride, and the like, alone or in a combination thereof, in an example embodiment of the present invention. The barrier layer 20 is formed to have a thickness of from about 100 Å to about 3000 Å, in an example embodiment of the present invention.

A seed layer (not shown) may be formed on the barrier layer 20 to serve as an electrode for forming a conductive layer 22 in a subsequent process. Such a seed layer is comprised of copper deposited by a physical vapor deposition (PVD) process, according to an example embodiment of the present invention.

The conductive layer 22 is formed from the seed layer to fill the remaining portion of the via hole 16. The conductive layer 22 is comprised of a metal having a low resistance and is formed by an electroplating process, an electroless plating process, an electrografting process, a PVD process, and the like, in an example embodiment of the present invention. A heat treatment process may be performed on the conductive layer 22. The conductive layer 22 is comprised of a metal such as copper or tungsten, in an example embodiment of the present invention.

Figure 6:
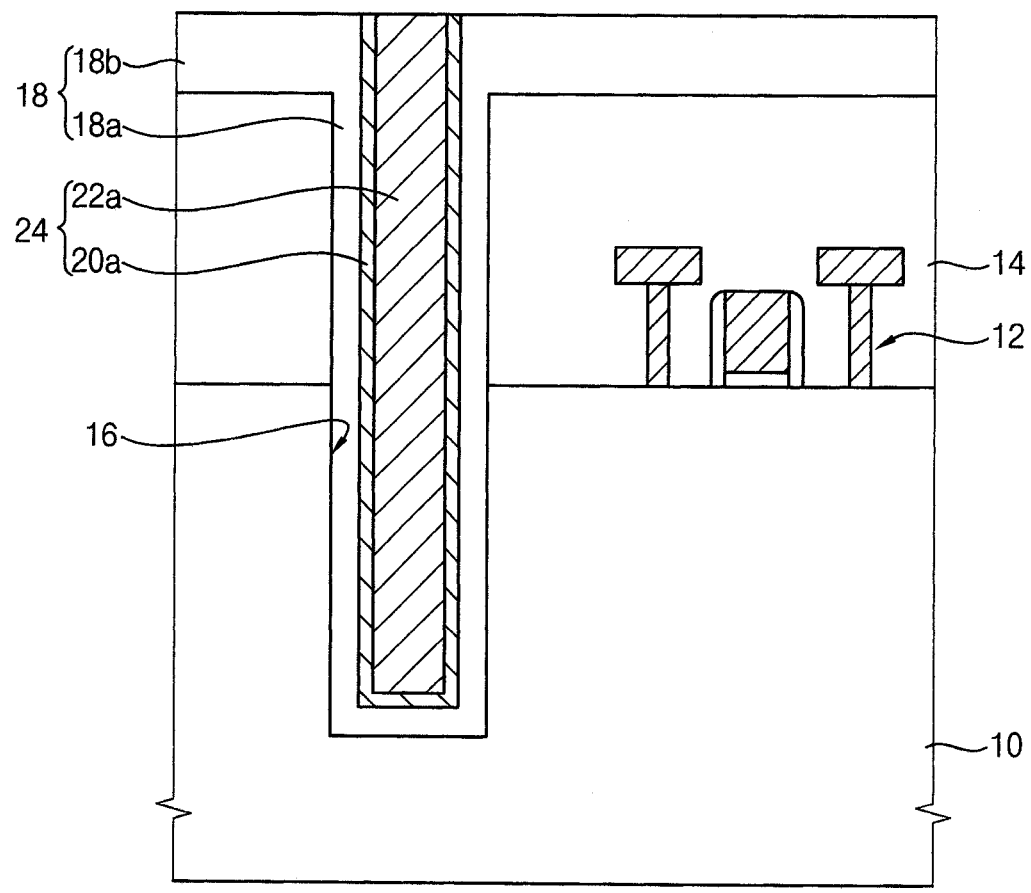

Referring to FIG. 6, upper portions of the conductive layer 22 and the barrier layer 20 are planarized by a chemical mechanical polishing (CMP) process and/or an etch back process until a top surface of the second insulation layer 18b is exposed. Thus, a conductive layer pattern 22a and a barrier layer pattern 20a remain within the via hole 16 to form the TSV structure 24.

In such a planarization process, an upper portion of the second insulation layer 18b may be removed. However, less than about 70% of the second insulation layer 18b is removed from such a planarization process, in an example embodiment of the present invention. That is, at least 30% of the original second insulation layer 18b remains to form a portion of the insulating interlayer.

Additionally during such a planarization process, a portion of the second insulation layer 18b remains such that the thickness of the removed object layer and the time for performing the planarization process may be reduced. As a result, damage to the elements of the semiconductor device on the first substrate 10 during such a planarization process may be reduced. Furthermore, the contact plug 28 is not yet formed and the first circuit pattern 12 is not exposed for not being damaged during such a planarization process.

Figure 7:
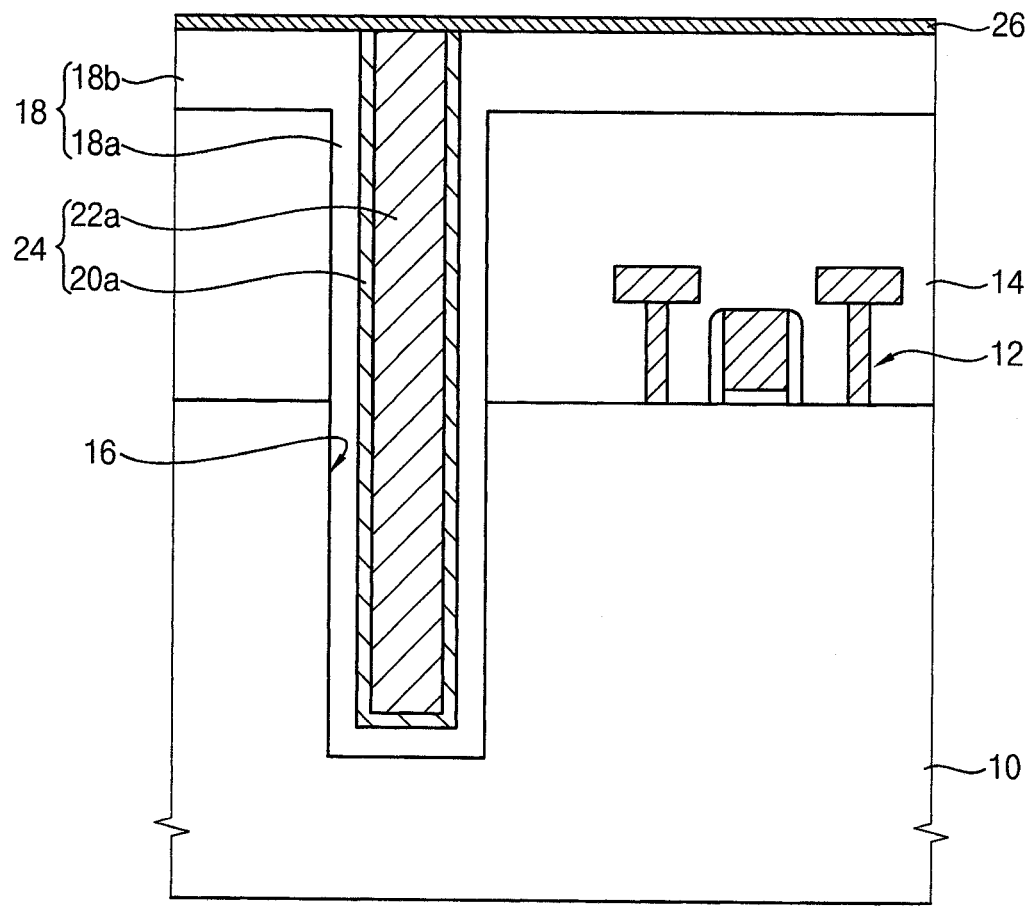

Referring to FIG. 7, the protective buffer layer 26 is formed on the second insulation layer 18b to cover the TSV structure 24. The buffer layer 26 is comprised of an insulating material such as silicon nitride, silicon carbonitride (SiCN), silicon carbo-oxynitride (SiCON), and the like, alone or in a combination thereof, in an example embodiment of the present invention. The protective buffer layer 26 has a thickness of from about 300 Å to about 1000 Å, in an example embodiment of the present invention. The buffer layer 26 prevents the conductive material of the TSV structure 24 from diffusing to other elements.

Figure 8:
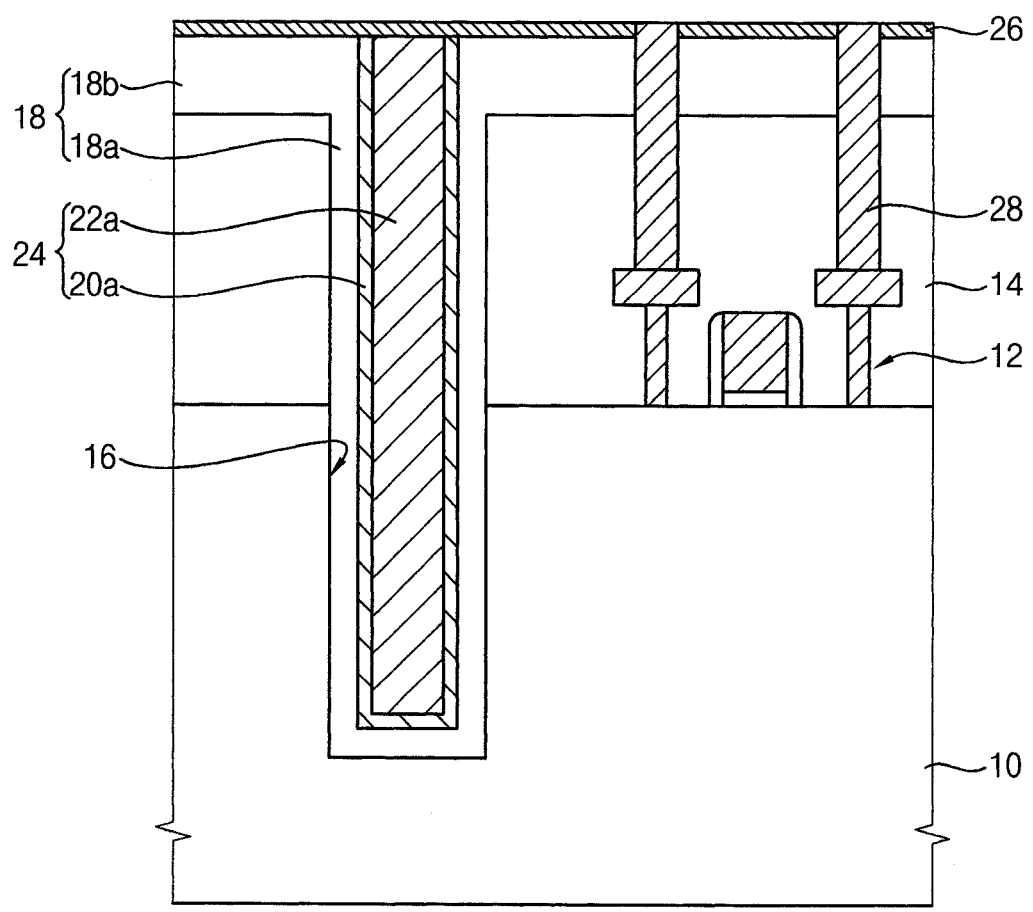

Referring to FIG. 8, the contact plugs 28 that are example conductive structures are formed through the buffer layer 26, the second insulation layer 18b, and portions of the first insulating interlayer 14 to be electrically connected to the first circuit pattern 12. Thus, a front-end-of-the-line (FEOL) process may be completed.

In particular, the buffer layer 26, the second insulation layer 18b, and the first insulating interlayer 14 are patterned to form contact holes therein. A barrier layer (not shown) and a conductive material are formed into such contact holes to form the contact plugs 28. An upper portion of the barrier layer and the conductive material for forming the conductive plugs 28 are planarized by a CMP process and/or an etch back process until a top surface of the buffer layer 26 is exposed. The contact plugs 28 are comprised of copper or tungsten, in an example embodiment of the present invention.

In this manner, the TSV structure 24 is formed in the FEOL process, and the contact plug 28 is formed after the TSV structure 24 is formed. Thus, the contact plug 28 is not damaged during formation of the TSV structure 24. Additionally, the TSV structure 24 is protected by the buffer layer 26 during formation of the contact plug 28 such that the TSV structure 24 is not damaged during the formation of the contact plug 28. As a result, the TSV structure 24 and the contact plug 28 are formed with high integrity to result in good conductivity characteristics.

Figure 9:
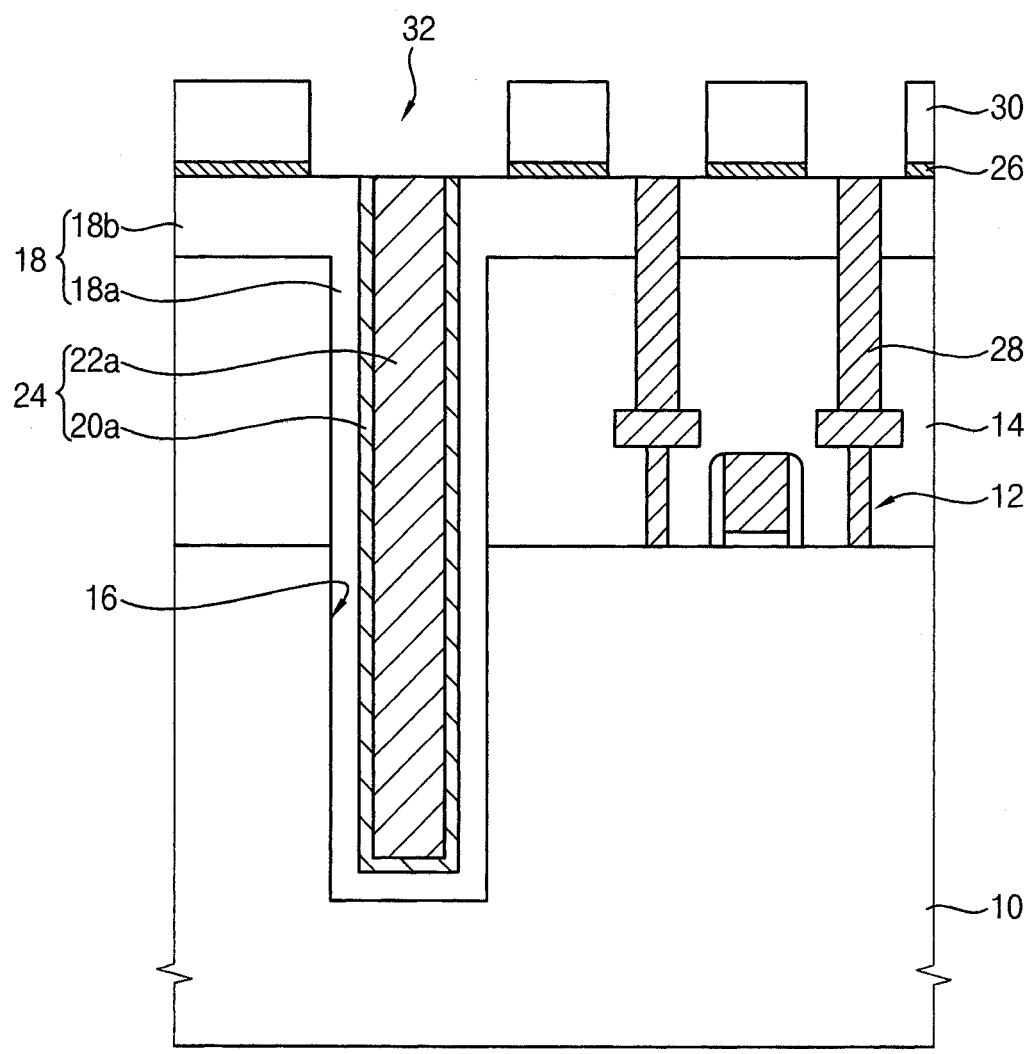

Referring to FIG. 9, the first inter-metal dielectric layer 30 is formed on the buffer layer 26 and the contact plug 28. The first inter-metal dielectric layer 30 is comprised of silicon oxide or carbon-doped silicon oxide, in an example embodiment of the present invention. The first inter-metal dielectric layer 30 and the buffer layer 26 are patterned to form first openings 32 exposing top surfaces of the TSV structure 24 and the contact plugs 28.

Figure 10:
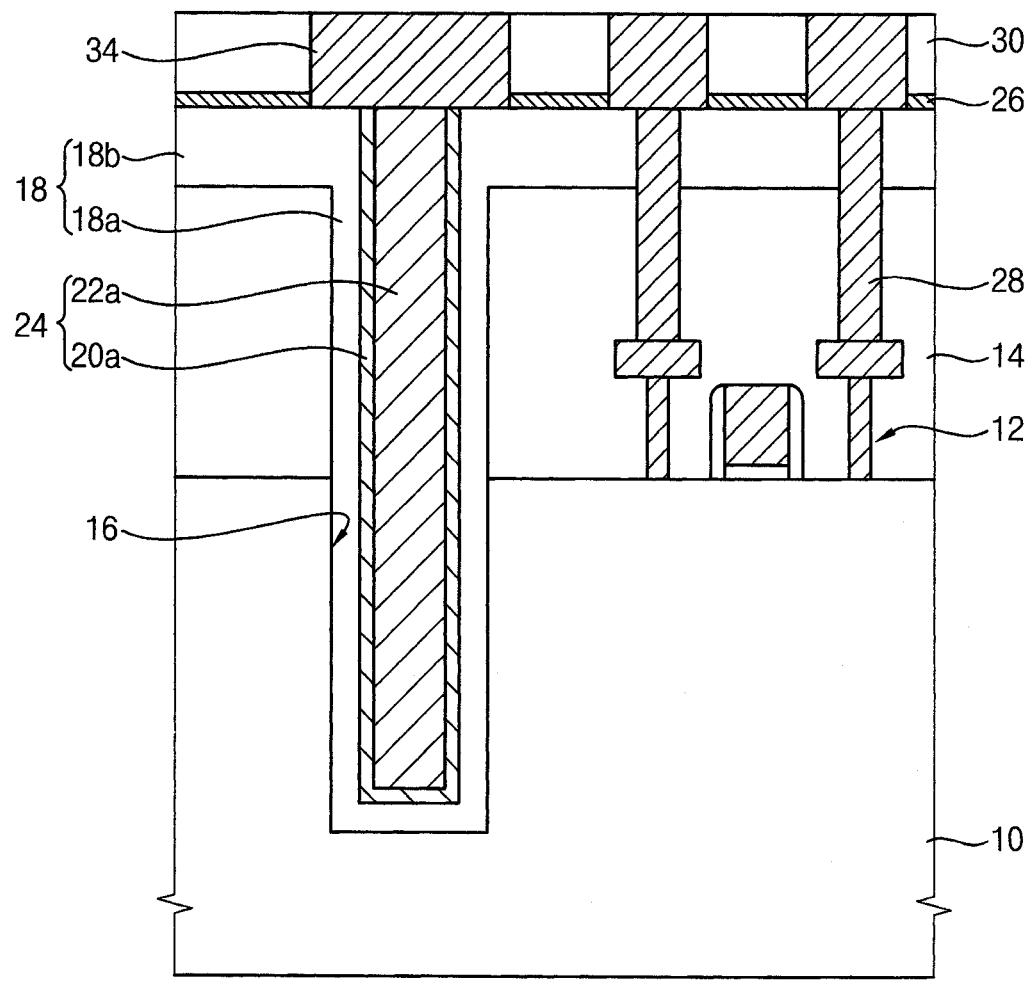

Referring to FIG. 10, a barrier layer (not shown) and a conductive layer are deposited onto the TSV structure 24, the contact plug 28, and the first inter-metal dielectric layer 30 to fill the first openings 32. Such a conductive layer is comprised of copper deposited by an electroplating process, an electroless plating process, an electrografting process, a PVD process, and the like, in an example embodiment of the present invention. Upper portions of the barrier layer and the conductive layer filling the first openings 32 are planarized until a top surface of the first inter-metal dielectric layer 30 is exposed to form first wirings 34 within the first openings 32.

Referring back to FIG. 1, a second inter-metal dielectric layer 36 is formed on the first inter-metal dielectric layer 30 and the first wirings 34. The second inter-metal dielectric layer 36 is patterned to form second openings (not shown), and second wirings 38 are formed in such second openings to be electrically connected to the first wirings 34. A third inter-metal dielectric layer (not shown) and third wirings (not shown) may be further formed.

In this manner, the semiconductor device of FIG. 1 has good insulation characteristics and a low parasitic capacitance between the first substrate 10 and the TSV structure 24. Additionally, the TSV structure 24 is formed to have low resistance and good signal transfer characteristics.

Figure 11:
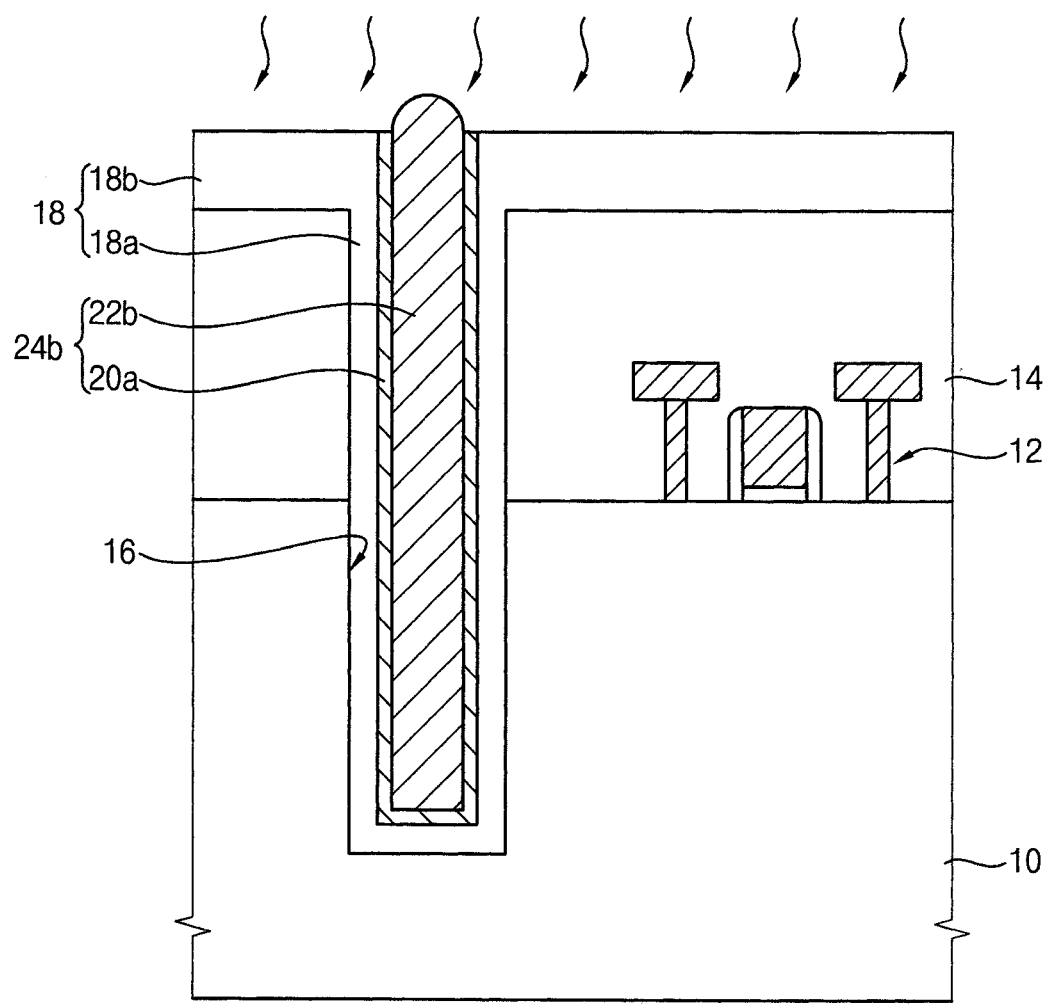
FIGS. 11 and 12 are cross-sectional views illustrating additional method steps during fabrication of the semiconductor device of FIG. 1, according to an example embodiment of the present invention.
Figure 12:
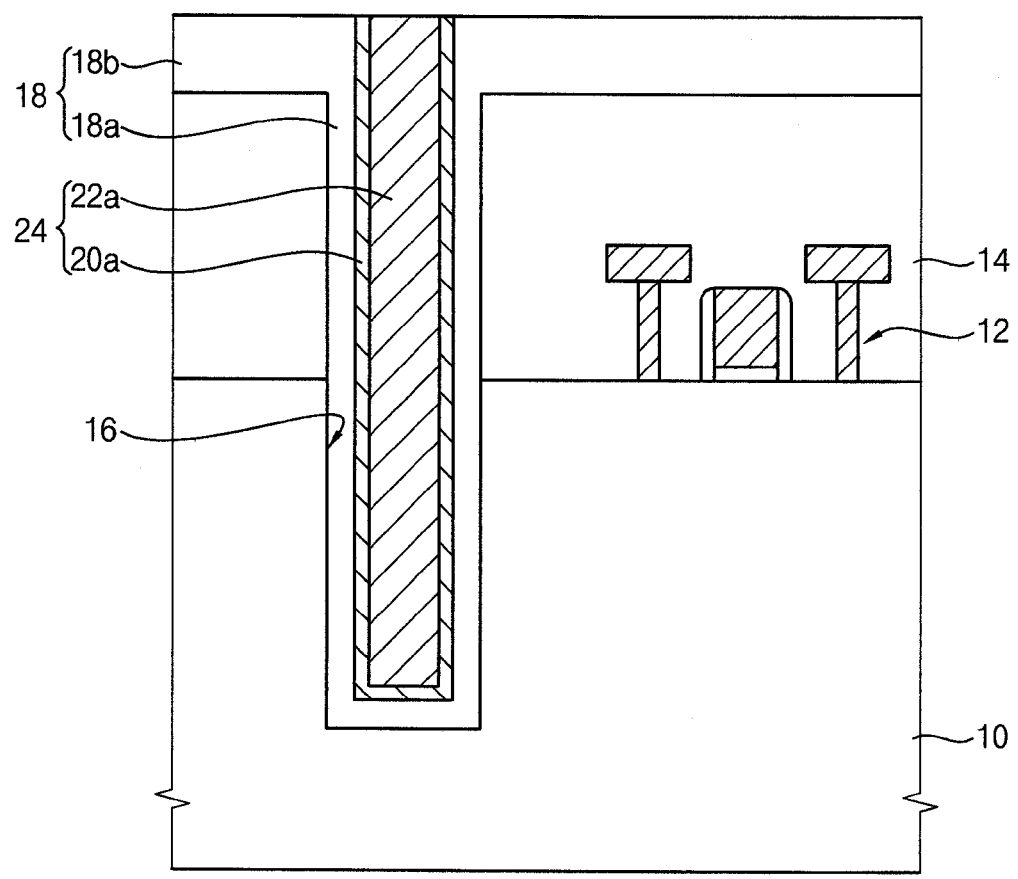

FIGS. 11 and 12 are cross-sectional views illustrating an additional treatment during fabrication of the semiconductor device of FIG. 1, according to an example embodiment of the present invention. Thus, method steps of FIGS. 2, 3, 4, 5, and 6 are performed to form the TSV structure 24 having the conductive fill 22a and the barrier layer pattern 20a in FIG. 6.

Subsequently referring to FIG. 11 after FIG. 6, a heat treatment process is performed after the TSV structure 24 is formed in FIG. 6 such that the TSV structure 24 is thermally expanded. Thus, the TSV structure 24 has an initial protrusion portion formed on the top surface to form an expanded conductive fill 22b to define an expanded TSV structure 24b.

When the heat treatment process is performed at a temperature of less than about 100° C., the TSV structure 24 may not be sufficiently expanded. When the heat treatment process is performed at a temperature of more than about 600° C., the TSV structure 24 may be deteriorated. Thus, the heat treatment process of FIG. 11 is performed at a temperature of from about 100° C. to about 600° C., according to an example embodiment of the present invention.

Referring to FIG. 12, an upper portion of the expanded TSV structure 24b is planarized by a CMP process and/or an etch back process to form the TSV structure 24 having a planar top surface with removal of the initial protrusion portion of FIG. 11. In this manner, the TSV structure 24 has already been thermally expanded such that the TSV structure 24 does not thermally expand as much in subsequent processes for forming the buffer layer 26 and the first inter-metal dielectric layer 30. After FIG. 12, the process steps of FIGS. 7, 8, 9, and 10 are performed to complete the semiconductor device.

Figure 13:
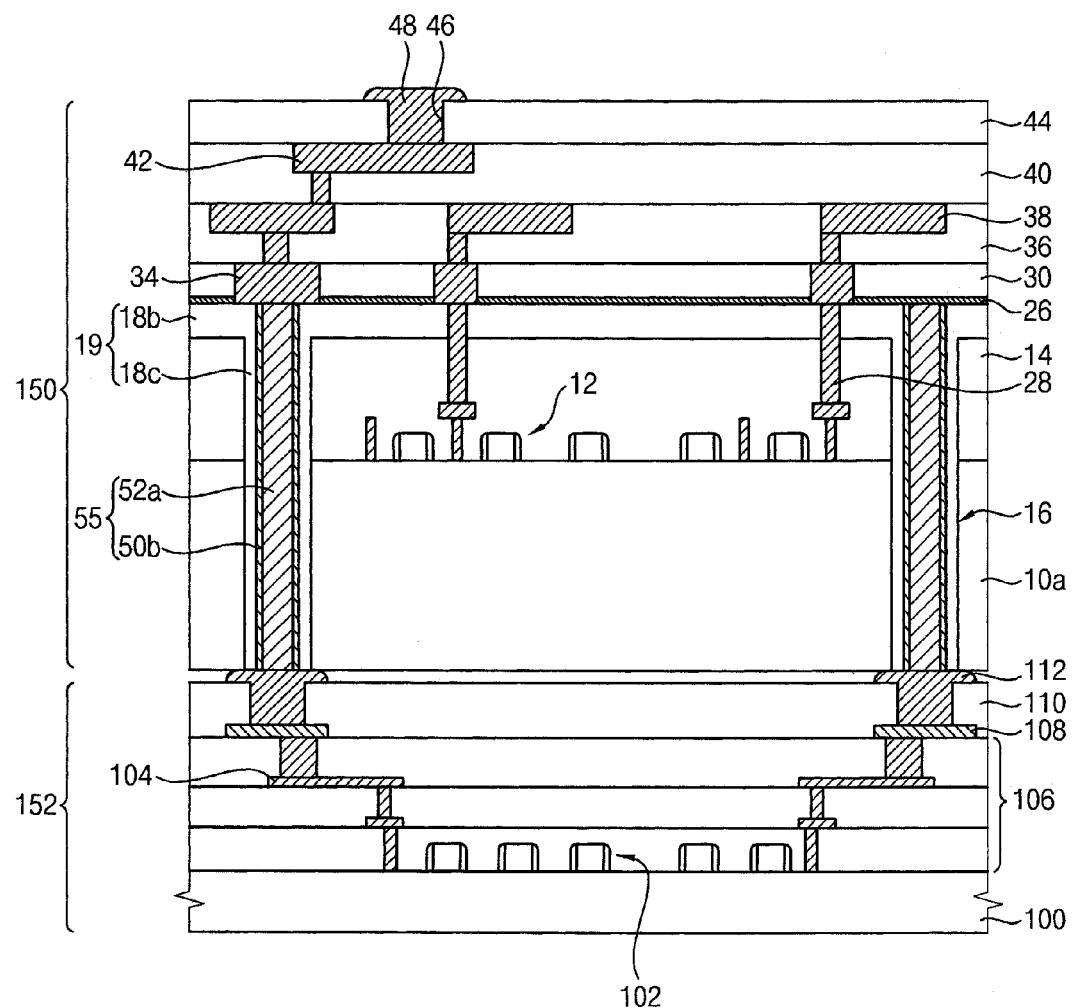
FIG. 13 is a cross-sectional view illustrating a stacked semiconductor device including the semiconductor device of FIG. 1, according to an example embodiment of the present invention.

FIG. 13 is a cross-sectional view illustrating a stacked semiconductor device including the semiconductor device of FIG. 1, according to an example embodiment of the present invention. Referring to FIG. 13, the stacked semiconductor includes a first integrated circuit chip 150, a second integrated circuit chip 152, a solder 48, and a contact structure 112.

For example, the first integrated circuit chip 150 includes a memory device, a logic device, or an imaging device formed therein. The first integrated circuit chip 150 is formed similarly as the semiconductor device of FIG. 1, except that bottom surfaces of a TSV structure 55 and a first insulation layer pattern 18c are exposed at a bottom surface of a first substrate 10a. Additionally, a first protection layer 44 is further formed on a third wiring 42 and a third inter-metal dielectric layer 40 with the solder 48 being formed through the first protection layer 44.

The first integrated circuit chip 150 includes the first substrate 10a, the first circuit pattern 12, the contact plug 28, the first insulating interlayer 14, and an insulation layer structure 19. The first integrated circuit chip 150 also includes a TSV structure 55 formed through the first insulating interlayer 14, the first substrate 10a, and the insulation layer structure 19.

First, second, and third wirings 34, 38, and 42 and first, second, and third inter-metal dielectric layers 30, 36, and 40 are also formed in the first integrated circuit chip 150. The first protection layer 44 covers the third wiring 42, and the solder 48 contacts the third wiring 42 through the first protection layer 44.

The first substrate 10a is comprised of single crystalline silicon, according to an example embodiment of the present invention. The first substrate 10a has a thickness of from about 10 μm to about 100 μm, according to an example embodiment of the present invention. The first substrate 10a has a bottom surface that is coplanar with that of the TSV structure 55, according to an example embodiment of the present invention. Alternatively, the present invention may also be practiced with the bottom surface of the TSV structure 55 being protruded from that of the first substrate 10a.

Further in FIG. 13, a via hole 16 is formed through the first substrate 10a and has a diameter of from about 1 μm to about 30 μm and preferably from about 1 μm to about 10 μm, according to an example embodiment of the present invention. The insulation layer structure 19 is formed on the sidewall of the via hole 16 and on the first insulating interlayer 14. The insulation layer structure 19 includes a first insulation layer pattern 18c and a second insulation layer pattern 18b.

The first insulation layer pattern 18c is formed on the sidewall of the via hole 16 and has a cylindrical shape to surround the TSV structure 55. The second insulation layer pattern 18b is formed on the first insulating interlayer 14 and on the top surface of the first insulation pattern 18c. A barrier layer pattern 50b and a seed layer (not shown) are formed on a sidewall of the first insulation layer pattern 18c within the via hole 16.

Further referring to FIG. 13, the conductive fill 52a is formed in the space surrounded by the barrier layer pattern 50b. The conductive fill 52a is comprised of a metal having a low resistance such as copper, aluminum, gold, indium, nickel, and the like, according to an example embodiment of the present invention. The first protection layer 44 is formed on the third inter-metal dielectric layer 40 to surround the third wiring 42. The first protection layer 44 is comprised of an insulating material such as polyimide for example. The third wiring 42 may also be referred as a first pad electrode 42.

The solder 48 is formed to be electrically connected to the first pad electrode 42. The solder 48 may contact a printed circuit board (PCB) (not shown). Alternatively, the first pad 42 may be electrically connected to a lead frame (not shown) by wire bonding.

The second integrated circuit chip 152 includes a second substrate 100, a second circuit pattern 102, wirings 104, second insulating inter-layers 106, and a second pad electrode 108. The present invention may be practiced with the second integrated circuit chip 152 including elements similar to those of the first integrated circuit chip 150. Alternatively, the present invention may be practiced with the second integrated circuit chip 152 including elements different from those of the first integrated circuit chip 150.

The second pad electrode 108 is formed on the second insulating inter-layers 106 to be electrically connected to the wirings 104. The second pad electrode 108 is electrically connected to the TSV structure 55 of the first substrate 10a. A second protection layer 110 is also formed on the second insulating inter-layers 106 to cover the second pad electrode 108. The second protection layer 110 is comprised of polyimide, according to an example embodiment of the present invention.

The contact structure 112 including a conductive material is formed through the second protection layer 110 to contact the second pad electrode 108 and the TSV structure 55 of the first integrated circuit chip 150. The contact structure 112 is comprised of silver solder paste, according to an example embodiment of the present invention.

The stacked semiconductor device of FIG. 13 includes the stacked first and second integrated circuit chips 150 and 152 that are electrically connected to each other by the TSV structure 55. The semiconductor device has a reduced parasitic capacitance between the TSV structure 55 and the first substrate 10a from the insulation pattern 18c. The semiconductor device of FIG. 13 may further have other chips (not shown) that are sequentially stacked on each other and that are be electrically connected to each other by TSV structures formed therein.

FIGS. 14, 15, 16, 17, 18, and 19 are cross-sectional views illustrating method steps during fabrication of the semiconductor device of FIG. 13, according to an example embodiment of the present invention.

Figure 14:
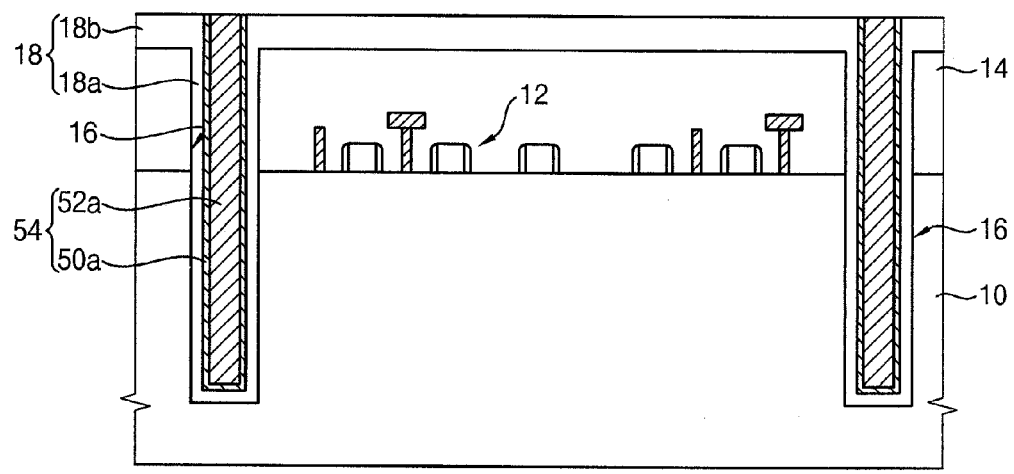
FIGS. 14, 15, 16, 17, 18, and 19 are cross-sectional views illustrating method steps during fabrication of the semiconductor device of FIG. 13, according to example embodiments of the present invention.

Referring to FIG. 14, the first circuit pattern 12 is formed on the first substrate 10, and the first insulating interlayer 14 is formed on the first substrate 10 to surround the first circuit pattern 12. The first insulating interlayer 14 and the first substrate 10 are patterned to form the via hole 16 through the first insulating interlayer 14 and a portion of the first substrate 10. The insulation layer structure 18 and a preliminary TSV structure 54 including a preliminary barrier layer pattern 50a and a conductive fill 52a are formed after formation of such a via hole 16 similarly as in FIG. 6.

Figure 15:
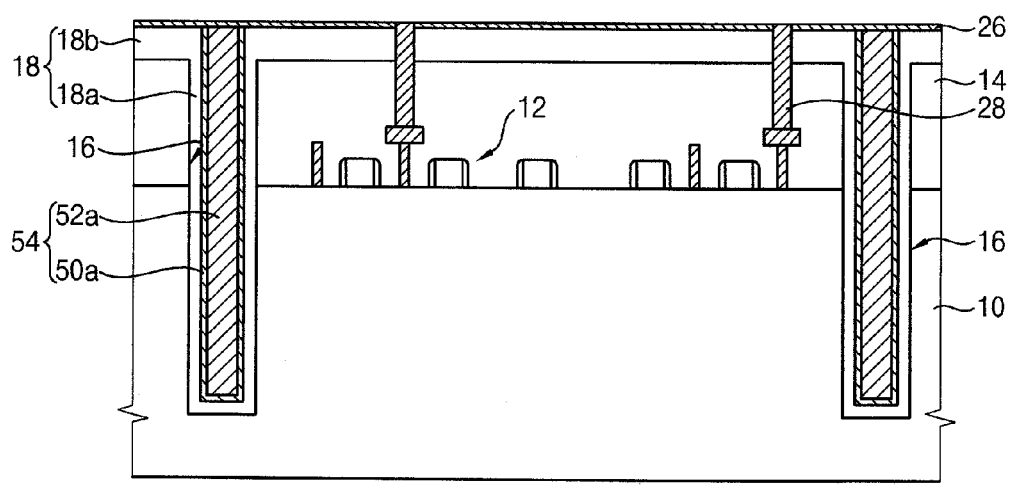

Referring to FIG. 15, the protective buffer layer 26 is formed on the first insulating interlayer 14 and the preliminary TSV structure 54. The buffer layer 26 is formed to have a thickness of from about 300 Å to about 1000 Å, according to an example embodiment of the present invention. Thereafter, the contact plug 28 is formed through the buffer layer 26 and the second insulation layer 18b and into the first insulating interlayer 14 to be electrically connected to the first circuit pattern 12.

Figure 16:
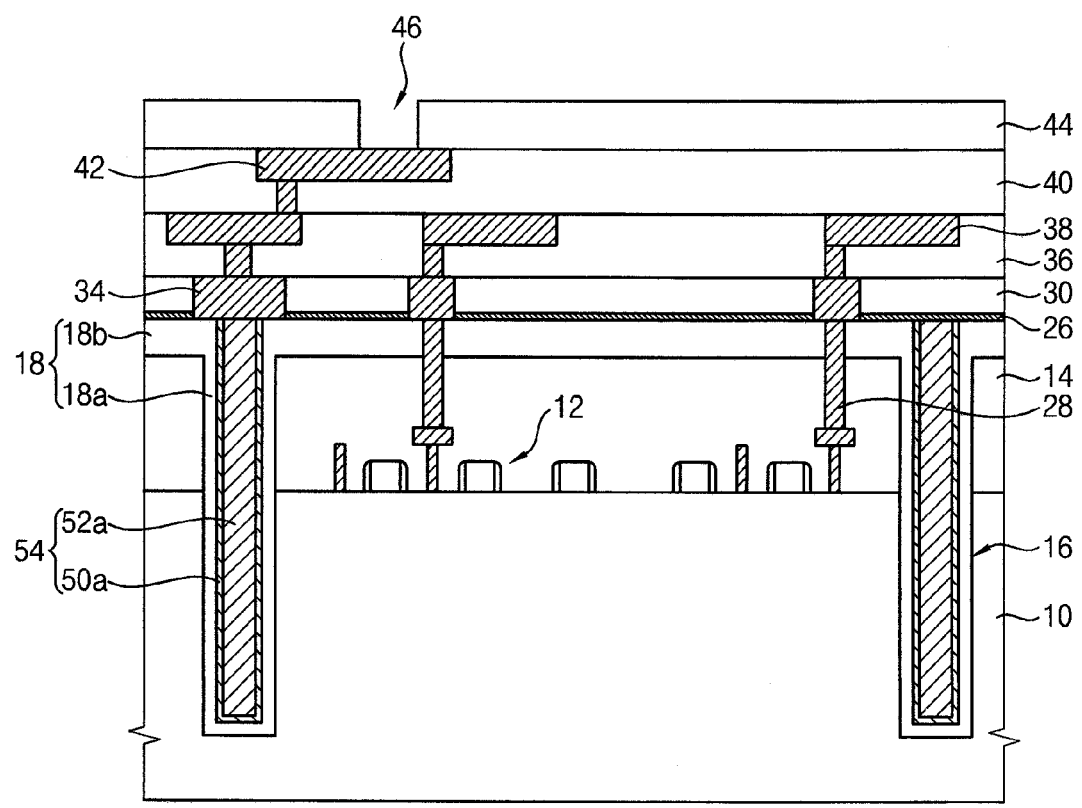

Referring to FIG. 16, the first inter-metal dielectric layer 30 is formed on the buffer layer 26. The first wirings 34 are formed through the first inter-metal dielectric layer 30 and the buffer layer 26 to be electrically connected respectively to the preliminary TSV structure 54 and the contact plug 28.

Second and third inter-metal dielectric layers 36 and 40 and second and third wirings 38 and 42 are formed on the first inter-metal dielectric layer 30 and the first wirings 34. In addition, a first protection layer 44 is formed on the third inter-metal dielectric layer 40 to cover the third wiring 42. The first protection layer 46 is comprised of polyimide, according to an example embodiment of the present invention. The first protection layer 46 is patterned to form an opening 46 exposing the third wiring 42.

Figure 17:
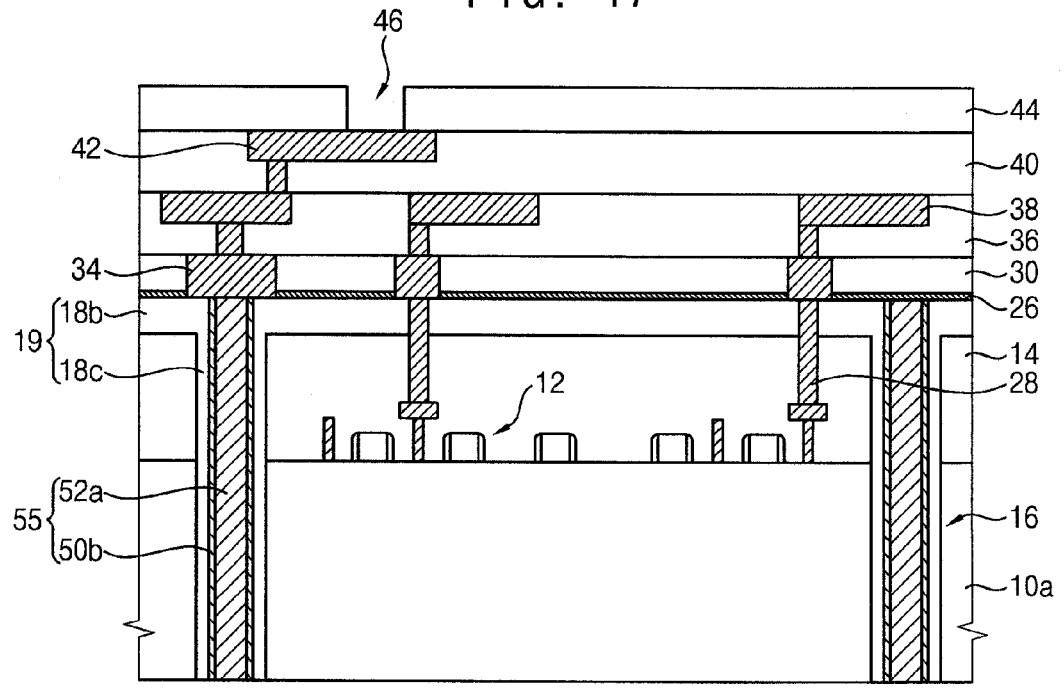

Referring to FIG. 17, bottom portions of the first substrate 10, the insulation layer structure 18, and the barrier layer pattern 50a are planarized by grinding to expose a bottom surface of the conductive fill 52a. Thus, the resulting first substrate 10a has a thickness that is less than that of the preliminary first substrate 10. The conductive fill 52a and the barrier layer pattern 50b remain within the via hole to define the TSV structure 55. Additionally with such grinding, the insulation layer structure 18 is transformed into the insulation layer pattern structure 19 including the first insulation layer pattern 18c and the second insulation layer pattern 18b.

The preliminary first substrate 10 is grinded until a bottom surface of the TSV structure 55 is exposed and for forming the insulation layer pattern structure 19, the barrier layer pattern 50b, and the first substrate 10a. The present invention may be practiced with the bottom surface of the conductive fill 52a being coplanar with that of the first substrate 10a. Alternatively, the present invention may be practiced with the bottom surface of the conductive fill 52a being protruded from that of the first substrate 10a.

Figure 18:
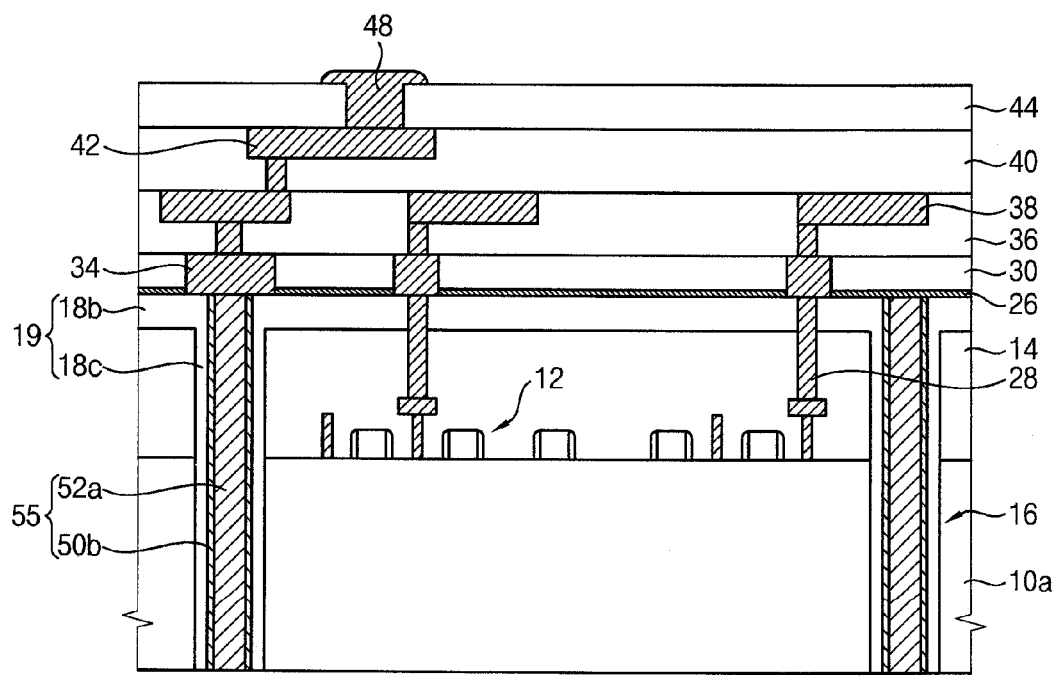

The first insulation layer pattern 18c has a cylindrical shape on the sidewall of the via hole 16. The barrier layer pattern 50b has a cylindrical shape on a sidewall of the first insulation layer pattern 18c. Referring to FIG. 18, the solder 48 is formed in the opening 46 to complete the first integrated circuit chip 150 with the TSV structure 55 in the first substrate 10a.

Figure 19:
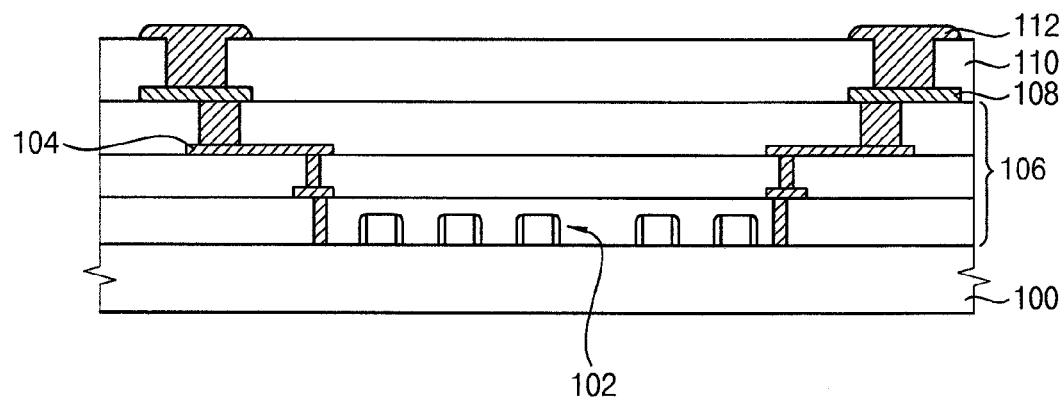

Referring to FIG. 19, the second integrated circuit chip 152 is formed in the second substrate 100. In addition, the second circuit pattern 102, the wirings 104, and the plurality of second insulating inter-layers 106 are formed for the second integrated circuit chip 152. The second pad electrode 108 is formed on the second insulating inter-layers 106 to be electrically connected to the wirings 104. The second pad electrode 108 is formed to be facing the TSV structure 55 of the first substrate 10a.

Further referring to FIG. 19, the second protection layer 110 is formed on the second insulating inter-layers 106 to cover the second pad electrode 108. The second protection layer 110 is patterned to form an opening (not shown) exposing the second pad electrode 108. The contact structure 112 is formed in such an opening to be electrically connected to the second pad electrode 108.

Referring back to FIG. 13, the bottom surface of the TSV structure 55 of the first substrate 10a is attached to the contact structure 112 of the second substrate 100. Thus, the stacked semiconductor device including the first and second integrated circuit chips 150 and 152 is completed.

Figure 20:
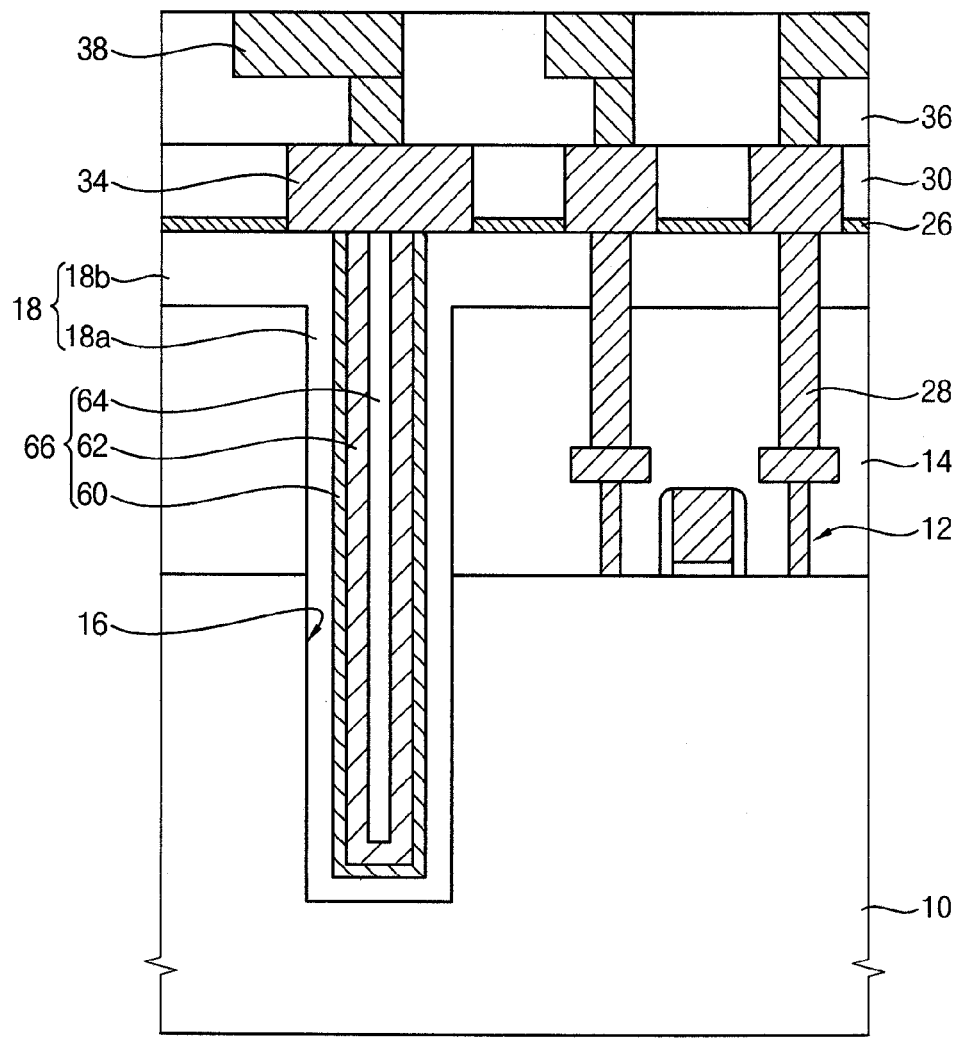
FIG. 20 is a cross-sectional view of a semiconductor device with a conductive structure and a via structure having a center fill, according to an example embodiment of the present invention.

FIG. 20 is a cross-sectional view of a semiconductor device with a conductive structure and a via structure having a center fill, according to an alternative embodiment of the present invention. The semiconductor device of FIG. 20 is similar to that of FIG. 1, except for the TSV structures.

Referring to FIG. 20, the insulation layer structure 18 including the first insulation layer 18a and the second insulation layer 18b are formed on an inner wall of the via hole 16 and on the first insulating interlayer 14. The first insulation layer 18a is formed on the inner wall of the via hole 16 for electrically insulating the first substrate 10 from a TSV structure 66 comprised of a conductive material.

The second insulation layer 18b is formed on the first insulating interlayer 14 and the first insulation layer 18a to serve as an insulating interlayer. The insulation layer structure 18 is comprised of a dielectric material having a low dielectric constant so that the parasitic capacitance between the first substrate 10 and the conductive material of the TSV structure 24 is minimized. For example, the insulation layer structure 18 is comprised of silicon oxide or carbon-doped silicon oxide, which may be porous, according to an example embodiment of the present invention.

The insulation layer structure 18 has a relatively high thickness so that the parasitic capacitance between the first substrate 10 and the TSV structure 24 is minimized. For example, the first insulation layer 18*a* has a thickness that is greater than about 1000 Å and less than about ¼ of the diameter of the via hole 16.

A barrier layer pattern 60 is formed on the first insulation layer 14 within the via hole and also has a top surface exposed within the via hole and coplanar with a top surface of the second insulation layer 18*b*. The barrier layer pattern 60 is comprised of a metal or a metal nitride such as tantalum, tantalum nitride, titanium, titanium nitride, ruthenium, cobalt, nickel, nickel boride, tungsten nitride, and the like, alone or in a combination thereof, according to an example embodiment of the present invention.

A conductive fill 62 is formed on the barrier layer pattern 60 within the via hole 16. The conductive fill 62 has a cup shape to surround a center fill 64 within the via hole 16. The conductive fill 62 is comprised of a metal having a low resistance such as copper, aluminum, gold, indium, nickel, and the like, alone or in a combination thereof, according to an example embodiment of the present invention. The conductive fill 74*a* is comprised of copper, according to an example embodiment of the present invention.

The center fill 64 is surrounded by the conductive fill 62 within the via hole 16. The center fill 64 is comprised of an insulating material or a conductive material such as spin on glass (SOG), flowable oxide (FOX), titanium, aluminum, a porous material, and the like, according to an example embodiment of the present invention.

In addition, the material of the center fill 64 has a thermal expansion coefficient that is from about three times to about four times lower than a thermal expansion coefficient of the material of the conductive fill 62. For example, the conductive fill 62 comprised of copper has a thermal expansion coefficient of 17 PPM (parts per million)/° C. In that case, the center fill 64 is comprised of a material having a lower thermal expansion coefficient of from about 3 PPM (parts per million)/° C. to about 4 PPM (parts per million)/° C. Thus, the center fill 64 buffers the thermal expansion of the conductive fill 62 during subsequent fabrication steps for forming the semiconductor device of FIG. 20.

The conductive fill 62, the barrier layer pattern 60 and the center fill 64 define the TSV structure 66. The TSV structure 66 has a top surface that is coplanar with that of the second insulation layer 18*b*.

The protective buffer layer 26 is formed on the TSV structure 66 and the second insulation layer 18*b*. The protective buffer layer 26 is comprised of silicon nitride, silicon carbo-nitride, silicon carbo-oxynitride, and the like, alone or in a combination thereof, according to an example embodiment of the present invention.

The contact plug 28 is formed through the second insulation layer 18*b* and in the first insulating interlayer 14 to be electrically connected to the first circuit pattern 12. The first and second wirings 34 and 38 and the first and second inter-metal dielectric layers 30 and 36 are formed on the second insulation layer 18*b*, the buffer layer 26, the TSV structure 66, and the contact plug 28.

The semiconductor device of FIG. 20 has a low parasitic capacitance and good insulation characteristics between the first substrate 10 and the TSV structure 66. Additionally, the TSV structure 66 has a low resistance and good signal transfer characteristics.

Figure 21:
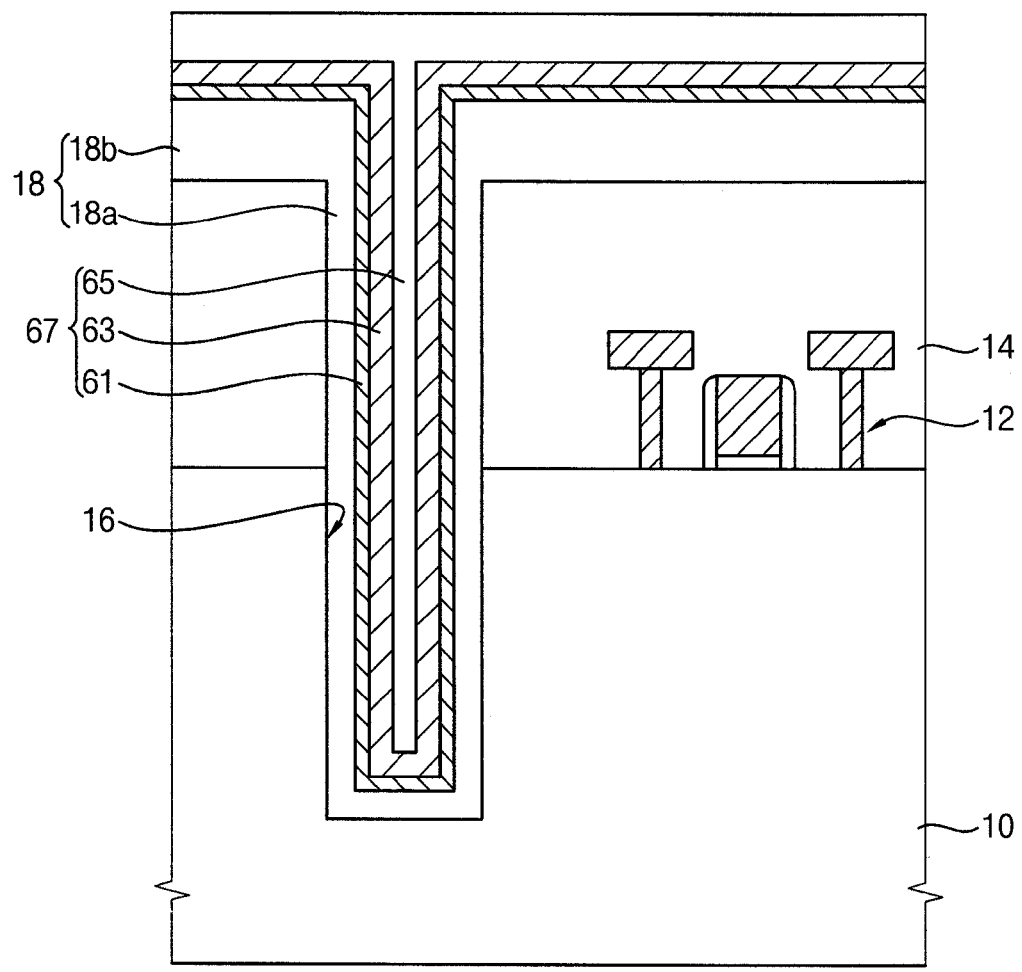
FIGS. 21 and 22 are cross-sectional views illustrating method steps during fabrication of the semiconductor device of FIG. 20, according to an example embodiment of the present invention.
Figure 22:
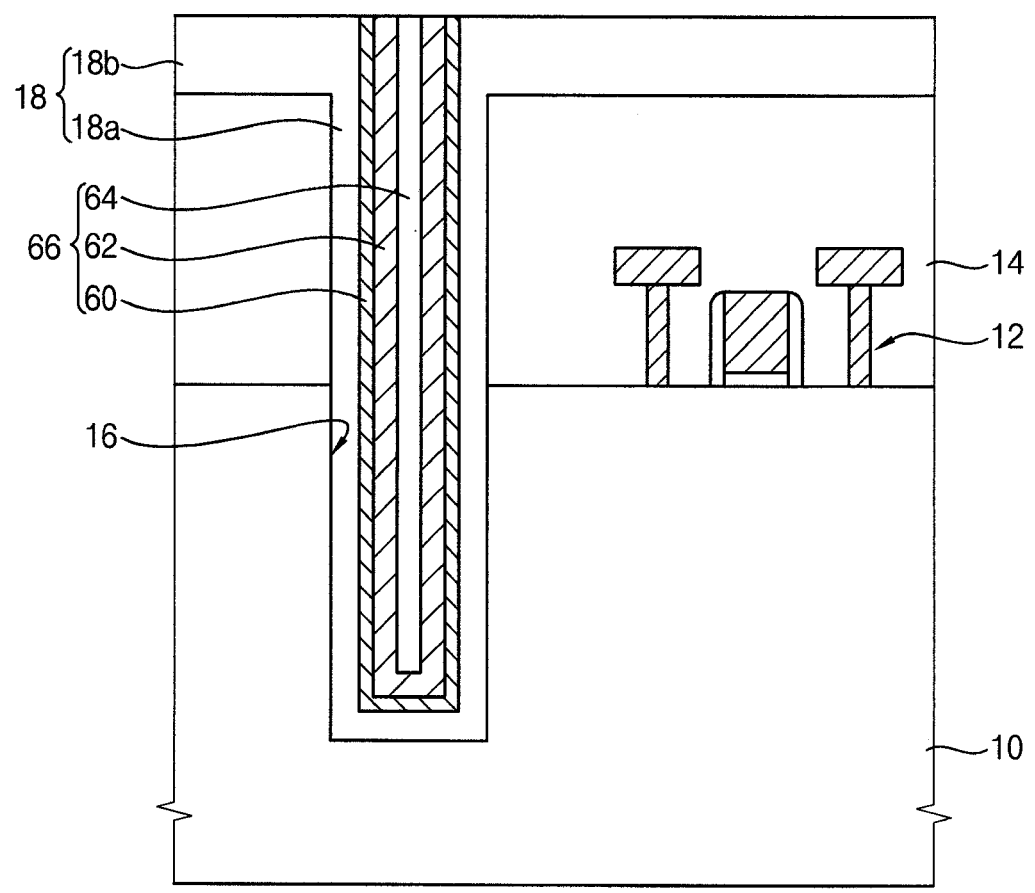

FIGS. 21 and 22 are cross-sectional views illustrating method steps during fabrication of the semiconductor device of FIG. 20, according to an example embodiment of the present invention.

The process steps as illustrated in FIGS. 2, 3, and 4 are first performed to form the first insulating interlayer 14 on the first substrate 10, and to form the via hole 16 through the first insulating interlayer 14 and into the first substrate 10. In addition, the insulation layer structure 18 is formed on the inner wall of the via hole 16 and on the first insulating interlayer 14.

Referring to FIG. 21, a barrier layer 61 is formed on the insulation layer structure 18, and a conductive layer 63 is formed on the barrier layer 61. The conductive layer 63 is comprised of a metal having a low resistance such as copper, aluminum, gold, indium, nickel, and the like, alone or in a combination thereof, according to an example embodiment of the present invention. In an example embodiment of the present invention, the conductive layer 63 is comprised of copper.

A center fill layer 65 is formed on the conductive layer 63 and fills the remaining portion of the via hole 16 after formation of the conductive layer 63. The center fill layer 65 is comprised of SOG, FOX, titanium, aluminum, a porous material, and the like, for example. The material of the center fill layer 65 has a thermal expansion coefficient that is from about three times to about four times lower than a thermal expansion coefficient of the material of the conductive layer 63.

For example, the conductive layer 63 comprised of copper has a thermal expansion coefficient of 17 PPM (parts per million)/° C. In that case, the center fill layer 65 is comprised of a material having a lower thermal expansion coefficient of from about 3 PPM (parts per million)/° C. to about 4 PPM (parts per million)/° C. Thus, the center fill layer 65 buffers the thermal expansion of the conductive layer 63 during subsequent fabrication steps.

Referring to FIG. 22, upper portions of the center fill layer 65, the conductive layer 63, and the barrier layer 61 may be removed until a top surface of the second insulation layer 18*b* is exposed. Thus, the TSV structure 66 is formed with the conductive fill 62, the barrier layer pattern 60, and the center fill 64 contained within the via hole 16. The process steps of FIGS. 7, 8, 9, and 10 may be further performed to complete the semiconductor device of FIG. 20.

Figure 23:
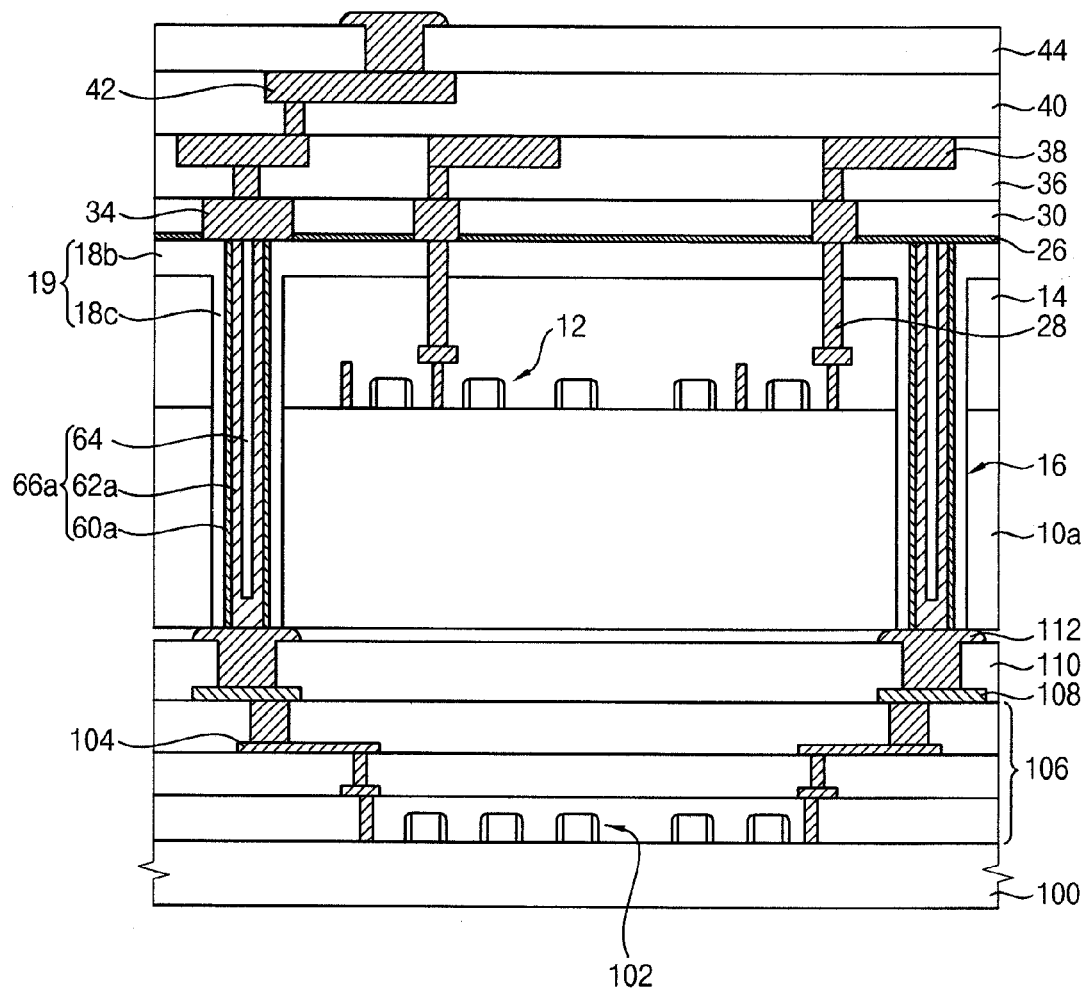
FIG. 23 is a cross-sectional view illustrating a stacked semiconductor device including the semiconductor device of FIG. 20, according to an example embodiment of the present invention.

FIG. 23 is a cross-sectional view illustrating a stacked semiconductor device including the semiconductor device of FIG. 20, according to an example embodiment of the present invention. The stacked semiconductor device of FIG. 23 is similar to that of FIG. 13, except the stacked semiconductor device of FIG. 23 includes the semiconductor device of FIG. 20 instead of the semiconductor device 1 that is included in FIG. 13.

Referring to FIG. 23, the stacked semiconductor device includes a first integrated circuit chip 150, a second integrated circuit chip 152, the solder 48, and the contact structure 112. The insulation layer pattern structure 19 is formed on the sidewall of the via hole 16 and on the first insulating interlayer 14. The insulation layer structure 19 may include the first insulation layer pattern 18*c* and the second insulation layer pattern 18*b*.

The first insulation layer pattern 18*c* is formed on the sidewall of the via hole 16 and has a cylindrical shape. The second insulation layer pattern 18*b* is formed on the first insulating interlayer 14 and on the first insulation layer pattern 18*c*. A barrier layer pattern 60*a* and a seed layer pattern (not shown) are formed on a sidewall of the first insulation layer pattern 18c and have a top surface that is coplanar with that of the second insulation layer pattern 18b.

Further in FIG. 23, a conductive fill 62a is formed on the barrier layer pattern 60a and has a cup shape surrounding the center fill 64. A bottom surface of the conductive fill 62a is exposed at the bottom surface of the first substrate 10a. The present invention may be practiced with the bottom surface of the conductive fill 62a being coplanar with the bottom surface of the first substrate 10a or being protrude from the bottom surface of the first substrate 10a.

The center fill 64 is formed in the space surrounded by the conductive fill 62a within the via hole 16 and has a top surface coplanar with the top surfaces of the conductive fill 62a, the barrier layer pattern 60a, and the second insulation layer pattern 18b. The center fill 64 is comprised of SOG, FOX, titanium, aluminum, a porous material, and the like, in an example embodiment of the present invention.

The stacked semiconductor device of FIG. 23 is fabricated according to the fabrication steps illustrated in FIGS. 21 and 22 to form the semiconductor device of FIG. 20. The wirings 34, 38 and 42 and the protection layer 44 are formed by process steps as illustrated and described with reference to FIG. 16. In addition, the process steps as illustrated and described with reference to FIGS. 17, 18, and 19 are performed to form the stacked semiconductor device of FIG. 23.

Figure 24:
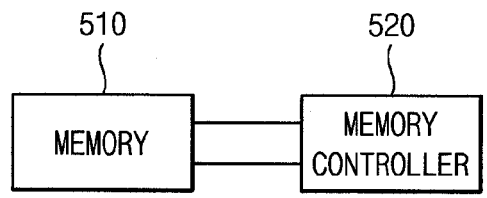
FIGS. 24, 25, and 26 show block diagrams of systems, each having a stacked semiconductor device, according to example embodiments of the present invention.

FIG. 24 is a block diagram of a system having a stacked semiconductor device such as shown in FIG. 13 or 23, according to an example embodiment of the present invention. Referring to FIG. 24, the system includes a controller 520 and a memory 510. The memory 510 is a DRAM device or a flash memory device being implemented as the stacked semiconductor device such as shown in FIG. 13 or 23 for example. The memory controller 520 provides an input signal for controlling operation of the memory 510.

Figure 25:
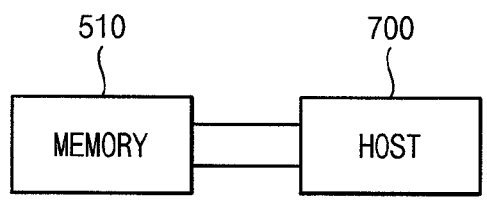

FIG. 25 is a block diagram illustrating a system having a stacked semiconductor device such as shown in FIG. 13 or 23, according to another example embodiment of the present invention. Referring to FIG. 25, the system includes a host 700 and a memory 510. The memory 510 is a DRAM device or a flash memory device being implemented as the stacked semiconductor device such as shown in FIG. 13 or 23 for example.

The host 700 may be included in a desktop computer, a laptop computer, a camera, a mobile device, a communication device, and the like. The host 700 provides an input signal for controlling and operating the memory 510. The memory 510 may serve as a data storing media.

Figure 26:
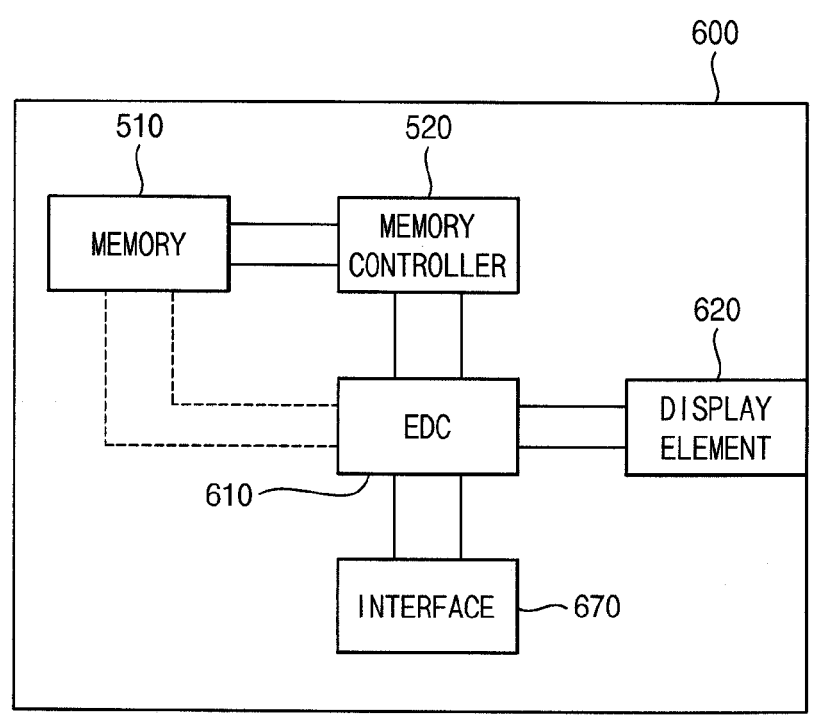

FIG. 26 is a block diagram of a system 600 having a stacked semiconductor device such as shown in FIG. 13 or 23, according to another example embodiment of the present invention. Referring to FIG. 26, the system 600 may be a portable device that includes a memory 510 implemented as the stacked semiconductor device such as shown in FIG. 13 or 23 for example. Examples of the portable device 600 include an MP3 player, a video player, a portable multi-media player (PMP), etc.

The portable device 600 includes the memory 510, a memory controller 520, an encoder/decoder (EDC) 610, a display element 620, and an interface 670. Data is input to or output from the memory 510 by way of the memory controller 520. As illustrated with the dashed lines of FIG. 26, data may be directly input from the EDC 610 to the memory 510, or data may be directly output from the memory 510 to the EDC 610.

The EDC 610 encodes data to be stored in the memory 510 such as by encoding audio and/or video data stored in the memory 510 of an MP3 player or a PMP player. Further, the EDC 610 may perform MPEG encoding for storing video data in the memory 510. Moreover, the EDC 610 may include multiple encoders to encode different types of data depending on their formats. For example, the EDC 610 may include an MP3 encoder for encoding audio data and an MPEG encoder for encoding video data.

The EDC 610 may also decode data that is output from the memory 510 such as by performing MP3 decoding for audio data from the memory 510. Alternatively, the EDC 610 may perform MPEG decoding of video data from the memory 510. Moreover, the EDC 610 may include multiple decoders to decode different types of data depending on their formats. For example, the EDC 610 may include an MP3 decoder for audio data and an MPEG decoder for video data.

In other embodiments, the EDC 610 may include only a decoder. For example, encoded data may be input to the EDC 610, and then the EDC 610 may decode the input data for transfer in the memory controller 520 or the memory 510.

The EDC 610 may receive data to be encoded or data being encoded by way of the interface 670. The interface 670 complies with established interface standards (e.g., FireWire, USB, etc.) to include a FireWire interface, a USB interface, etc. Thus, data may be output from the memory 510 by way of the interface 670.

The display element 620 displays a representation of user data that is output from the memory 510 and decoded by the EDC 610. Examples of the display element 620 include a speaker outputting an audio representation of the data, a display screen outputting a video representation of the data, etc.

According to example embodiments of the present invention, the semiconductor device has a low parasitic capacitance and good insulation characteristics between the TSV structure and the substrate. In addition, the conductive structure electrically connected to a circuit pattern is formed after formation of the protective buffer layer on the TSV structure to prevent deterioration to the conductive structure and the TSV structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept.

Accordingly, all such modifications are intended to be included within the scope of the present inventive concept as defined in the claims. In the claims, means-plus-function clauses are intended to cover the structures described herein as performing the recited function and not only structural equivalents but also equivalent structures.

Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

The present invention is limited only as defined in the following claims and equivalents thereof.

The invention claimed is:

1. A semiconductor device, comprising:
   at least one circuit pattern on a substrate;
   an insulating interlayer on the substrate, the insulating interlayer covering the circuit pattern and having a via hole therethrough, the via hole being also formed through at least a portion of the substrate;
   an insulation layer structure on an inner wall of the via hole and on a top surface of the insulating interlayer, wherein the insulation layer structure includes a first insulation layer and a second insulation layer, the first insulation layer being on the inner wall of the via hole, the second insulation layer being on the first insulation layer and the top surface of the insulating interlayer and having a thickness different from that of the first insulation layer, and the first and second insulation layers forming a single continuous layer;
a through silicon via (TSV) structure filling a remaining portion of the via hole, the TSV structure having a top surface coplanar with a top surface of the second insulation layer;
a buffer layer on the top surfaces of the TSV structure and the insulation layer structure;
a conductive structure through the second insulation layer and at least a portion of the insulating interlayer, the conductive structure being electrically connected to the circuit pattern and having a to surface coplanar with the to surface of the TSV structure; and
at least one first wiring on the second insulation layer and the TSV structure through the buffer layer, the first wiring being electrically connected to the TSV structure and spaced apart from the insulating interlayer by the second insulation layer.

2. The device of claim 1, wherein the first and second insulation layers include substantially the same material.

3. The device of claim 1, wherein the first insulation layer has a thickness more than about 1000 Å and less than about ¼ of the diameter of the via hole.

4. The device of claim 1, wherein the insulation layer structure includes silicon oxide or carbon-doped silicon oxide.

5. The device of claim 1, wherein the TSV structure includes a barrier layer pattern and a conductive fill, the barrier layer pattern being on the insulation layer structure, and the conductive fill filling an inner space formed by the barrier layer pattern.

6. The device of claim 1, wherein the barrier layer pattern includes a metal or a metal nitride, and the conductive fill includes a metal having a low resistance.

7. The device of claim 1, wherein the buffer layer includes silicon nitride, silicon carbonitride (SiCN), or silicon carbooxynitride (SiCON).

8. The device of claim 1, further comprising at least one second wiring on the insulating interlayer and the conductive structure through the buffer layer, and wherein the conductive structure is a contact plug electrically connecting the circuit pattern to the second wiring.

9. A semiconductor device, comprising:
a first integrated circuit chip including:
at least one first circuit pattern on a first substrate;
an insulating interlayer on the substrate, the insulating interlayer covering the circuit pattern and having a via hole therethrough, the via hole being also formed through the first substrate;
an insulation layer structure on a sidewall of the via hole and on a top surface of the insulating interlayer,
wherein the insulation layer structure includes a first insulation layer and a second insulation layer, the first insulation layer being on the inner wall of the via hole, the second insulation layer being on the first insulation layer and the top surface of the insulating interlayer and having a thickness different from that of the first insulation layer, and the first and second insulation layers forming a single continuous layer;
a through silicon via (TSV) structure filling a remaining portion of the via hole, the TSV structure having a top surface coplanar with a top surface of the second insulation layer;
a buffer layer on the top surfaces of the TSV structure and the second insulation layer;
a conductive structure through the second insulation layer and at least a portion of the insulating interlayer, the conductive structure being electrically connected to the first circuit pattern and having a top surface coplanar with the top surface of the TSV structure; and
at least one first wiring on the second insulation layer and the TSV structure through the buffer layer, the first wiring being electrically connected to the TSV structure and spaced apart from the insulating interlayer by the second insulation layer;
a second integrated chip including:
at least one second circuit pattern on a second substrate; and
at least one second wiring electrically connected to the second circuit pattern; and
a contact structure electrically connecting the TSV structure of the first integrated chip to the second wiring of the second integrated chip.

10. The device of claim 9, wherein the TSV structure has a bottom surface coplanar with a bottom surface of the first substrate.

11. The device of claim 9, wherein the TSV structure has a bottom surface protruding from a bottom surface of the first substrate.

12. The device of claim 9, wherein the first integrated chip further includes at least one third wiring on the insulating interlayer and the conductive structure through the buffer layer, and wherein the conductive structure is a contact plug electrically connecting the first circuit pattern to the third wiring.

13. The device of claim 9, wherein the first integrated chip further includes:
a first pad electrode electrically connected to the third wiring; and
a solder electrically connecting the first pad electrode to an external printed circuit board (PCB).

14. The device of claim 9, wherein the second integrated chip further includes a second pad electrode electrically connecting the second wiring to the contact structure.

15. A semiconductor device, comprising:
at least one circuit pattern on a substrate;
an insulating interlayer on the substrate, the insulating interlayer covering the circuit pattern and having a via hole therethrough, the via hole being also formed through at least a portion of the substrate;
an insulation layer structure on an inner wall of the via hole and on a top surface of the insulating interlayer;
a through silicon via (TSV) structure filling a remaining portion of the via hole, the TSV structure having a top surface coplanar with a top surface of the insulation layer structure;
wherein the TSV structure is comprised of a center fill layer and a conductive layer within the via hole with the center fill layer having a lower thermal expansion coefficient than the conductive layer;
a buffer layer on the top surfaces of the TSV structure and the insulation layer structure; and a conductive structure through the insulation layer structure and at least a portion of the insulating interlayer, the conductive structure being electrically connected to the circuit pattern.

16. The device of claim 15, wherein the center fill layer is surrounded by the conductive layer within the via hole, and wherein a first thermal coefficient of the center fill is from about three times to about four times lower than a second thermal coefficient of the conductive layer.

* * * * *